(12) United States Patent
Arneson et al.

(10) Patent No.: US 7,795,076 B2
(45) Date of Patent: Sep. 14, 2010

(54) METHOD, SYSTEM, AND APPARATUS FOR TRANSFER OF DIES USING A DIE PLATE HAVING DIE CAVITIES

(75) Inventors: Michael R. Arneson, Westminster, MD (US); William R. Bandy, Gambrills, MD (US)

(73) Assignee: Symbol Technologies, Inc., Holtsville, NY (US)

( * ) Notice: Subject to any disclaimer, the term of this patent is extended or adjusted under 35 U.S.C. 154(b) by 89 days.

(21) Appl. No.: 10/866,150

(22) Filed: Jun. 14, 2004

(65) Prior Publication Data

US 2005/0009232 A1 Jan. 13, 2005

Related U.S. Application Data

(60) Provisional application No. 60/477,735, filed on Jun. 12, 2003.

(51) Int. Cl.
*H01L 21/00* (2006.01)
(52) U.S. Cl. ............... 438/110; 438/464; 257/E21.499
(58) Field of Classification Search ............... 438/464, 438/110; 257/E21.499, E21.603
See application file for complete search history.

(56) References Cited

U.S. PATENT DOCUMENTS

| | | | |
|---|---|---|---|
| 2,782,487 A | 2/1957 | Properzi | |
| 3,010,427 A | 11/1961 | Hautau | |
| 3,724,737 A | 4/1973 | Bodnar | |
| 3,891,157 A | 6/1975 | Justus | |
| 3,989,575 A | 11/1976 | Davies et al. | |
| 4,040,169 A | 8/1977 | Rose | |
| 4,231,153 A | 11/1980 | Browne | |
| 4,298,120 A * | 11/1981 | Kaneko et al. | 206/714 |
| 4,342,090 A | 7/1982 | Caccoma et al. | |
| 4,451,324 A | 5/1984 | Ichikawa et al. | |
| 4,452,557 A | 6/1984 | Bouwknegt et al. | |

(Continued)

FOREIGN PATENT DOCUMENTS

DE 196 34 473 C2 1/1998

(Continued)

OTHER PUBLICATIONS

English Language Abstract for DE 19634473, published Jan. 22, 1998, 1 page.

(Continued)

*Primary Examiner*—Jarrett J Stark
(74) *Attorney, Agent, or Firm*—Bartholomew J. DiVita

(57) ABSTRACT

A method, system, and apparatus for transfer of dies using a die plate having die cavities is described herein. The die plate has a planar body. The body has a plurality of cells or cavities which are open at the first surface of the body. Each cell has a hole extending from the bottom surface of the cell to a second surface of the body. A wafer or support structure can be positioned to be closely adjacent to each other. A suction can be applied to the second surface of the die plate so that a plurality of dies can be transferred into a plurality of cells of the die plate. The dies can subsequently be transferred from the die plate having die cavities to one or more destination substrates or surfaces, by a punching mechanism.

6 Claims, 35 Drawing Sheets

U.S. PATENT DOCUMENTS

| | | | |
|---|---|---|---|
| 4,480,742 A | 11/1984 | Muylle | |
| 4,914,809 A | 4/1990 | Fukai et al. | |
| 4,925,808 A | 5/1990 | Richardson | |
| 4,953,283 A | 9/1990 | Kawabata et al. | |
| 4,965,927 A | 10/1990 | Holzman | |
| 5,147,210 A | 9/1992 | Patterson et al. | |
| 5,255,430 A | 10/1993 | Tallaksen | |
| 5,256,578 A | 10/1993 | Corley et al. | |
| 5,510,723 A | 4/1996 | Canella et al. | |
| 5,519,381 A | 5/1996 | Marsh et al. | |
| 5,528,222 A | 6/1996 | Moskowitz et al. | |
| 5,537,105 A | 7/1996 | Marsh et al. | |
| 5,557,280 A | 9/1996 | Marsh et al. | |
| 5,564,888 A | 10/1996 | Doan | |
| 5,566,441 A | 10/1996 | Marsh et al. | |
| 5,585,193 A | 12/1996 | Josephy et al. | |
| 5,616,759 A | 4/1997 | DeLuca et al. | |
| 5,618,759 A | 4/1997 | Boysel | |
| 5,725,728 A | 3/1998 | Fuke et al. | |
| 5,827,394 A | 10/1998 | Lu | |
| 5,837,349 A | 11/1998 | Van Erden et al. | |
| 5,840,594 A * | 11/1998 | Tsubouchi et al. | 438/15 |
| 5,862,117 A | 1/1999 | Fuentes et al. | |
| 5,880,934 A | 3/1999 | Haghiri-Tehrani | |
| 5,904,546 A | 5/1999 | Wood et al. | |
| 5,911,456 A * | 6/1999 | Tsubouchi et al. | 29/833 |
| 5,946,198 A | 8/1999 | Hoppe et al. | |
| 5,953,590 A | 9/1999 | Piper et al. | |
| 5,966,903 A | 10/1999 | Dudderar et al. | |
| 5,976,306 A | 11/1999 | Davis et al. | |
| 5,982,284 A | 11/1999 | Baldwin et al. | |
| 6,002,344 A | 12/1999 | Bandy et al. | |
| 6,018,299 A | 1/2000 | Eberhardt | |
| 6,027,027 A | 2/2000 | Smithgall | |
| 6,044,046 A | 3/2000 | Diezmann et al. | |
| 6,082,660 A | 7/2000 | Meyer | |
| 6,091,332 A | 7/2000 | Eberhardt et al. | |
| 6,107,920 A | 8/2000 | Eberhardt et al. | |
| 6,121,118 A | 9/2000 | Jin | |
| 6,135,522 A | 10/2000 | Su et al. | |
| 6,145,901 A | 11/2000 | Rich | |
| 6,147,662 A | 11/2000 | Grabau et al. | |
| 6,165,386 A | 12/2000 | Endo et al. | |
| 6,169,319 B1 | 1/2001 | Malinovich et al. | |
| 6,173,750 B1 | 1/2001 | Davis et al. | |
| 6,189,591 B1 | 2/2001 | Ariye et al. | |
| 6,202,292 B1 | 3/2001 | Farnworth et al. | |
| 6,204,092 B1 * | 3/2001 | Freund et al. | 438/113 |
| 6,205,745 B1 | 3/2001 | Dudderar et al. | |
| 6,206,292 B1 | 3/2001 | Robertz et al. | |
| 6,215,194 B1 | 4/2001 | Nakabayashi | |
| 6,226,109 B1 | 5/2001 | Tompkin et al. | |
| 6,248,199 B1 | 6/2001 | Smulson | |
| 6,248,201 B1 | 6/2001 | Boyd, IV et al. | |
| 6,262,692 B1 | 7/2001 | Babb | |
| 6,265,977 B1 | 7/2001 | Vega et al. | |
| 6,281,795 B1 | 8/2001 | Smith et al. | |
| 6,283,693 B1 * | 9/2001 | Acello et al. | 414/403 |
| 6,283,703 B1 | 9/2001 | Dowling et al. | |
| 6,303,462 B1 | 10/2001 | Gidon | |
| 6,303,468 B1 | 10/2001 | Aspar et al. | |
| 6,322,903 B1 | 11/2001 | Siniaguine et al. | |
| 6,331,225 B1 | 12/2001 | Sugiyama | |
| 6,359,842 B1 | 3/2002 | Taguchi et al. | |
| 6,370,750 B1 * | 4/2002 | Matsumura et al. | 29/33 M |
| 6,416,608 B1 | 7/2002 | Mynott et al. | |
| 6,446,692 B1 | 9/2002 | Sugiyama | |
| 6,451,154 B1 | 9/2002 | Grabau et al. | |
| 6,483,174 B1 * | 11/2002 | Crafts et al. | 257/662 |
| 6,514,790 B1 | 2/2003 | Plettner et al. | |
| 6,521,511 B1 | 2/2003 | Inoue et al. | |
| 6,534,386 B2 | 3/2003 | Irie | |
| 6,554,128 B1 | 4/2003 | Davis et al. | |
| 6,555,400 B2 | 4/2003 | Farnworth et al. | |
| 6,606,247 B2 | 8/2003 | Credelle et al. | |
| 6,608,370 B1 | 8/2003 | Chen et al. | |
| 6,617,963 B1 | 9/2003 | Watters et al. | |
| 6,692,978 B2 | 2/2004 | Tandy et al. | |
| 6,731,353 B1 | 5/2004 | Credelle et al. | |
| 6,773,543 B2 | 8/2004 | Summers | |
| 6,780,672 B2 | 8/2004 | Steele et al. | |
| 6,848,162 B2 | 2/2005 | Arneson et al. | |
| 6,868,800 B2 | 3/2005 | Moroz | |
| 6,879,029 B2 | 4/2005 | Ueda et al. | |
| 6,891,515 B1 | 5/2005 | Langley et al. | |
| 6,915,551 B2 | 7/2005 | Arneson et al. | |
| 6,951,596 B2 | 10/2005 | Green et al. | |
| 7,023,347 B2 | 4/2006 | Arneson et al. | |
| 7,060,593 B2 * | 6/2006 | Kurosawa et al. | 438/464 |
| 7,075,436 B2 | 7/2006 | Shanks et al. | |
| 7,086,073 B2 | 8/2006 | Benedikt et al. | |
| 7,102,524 B2 | 9/2006 | Arneson et al. | |
| 7,102,526 B2 | 9/2006 | Zweig | |
| 7,117,581 B2 | 10/2006 | Arneson et al. | |
| 7,147,739 B2 * | 12/2006 | Hiller et al. | 156/230 |
| 7,223,320 B2 | 5/2007 | Arneson et al. | |
| 7,276,388 B2 | 10/2007 | Arneson et al. | |
| 7,363,642 B2 | 4/2008 | Oshima et al. | |
| 7,378,971 B2 | 5/2008 | Andrechak et al. | |
| 7,404,199 B2 | 7/2008 | Arneson et al. | |
| 7,543,316 B2 | 6/2009 | Arneson et al. | |
| 2001/0014524 A1 | 8/2001 | Farrar | |
| 2001/0016400 A1 | 8/2001 | Lee | |
| 2002/0020491 A1 | 2/2002 | Price et al. | |
| 2002/0050591 A1 | 5/2002 | Tandy | |
| 2002/0081772 A1 * | 6/2002 | Madrid et al. | 438/108 |
| 2003/0024635 A1 | 2/2003 | Utsunomiya | |
| 2003/0089970 A1 | 5/2003 | Gates et al. | |
| 2003/0136503 A1 | 7/2003 | Green et al. | |
| 2003/0140476 A1 | 7/2003 | Barretto et al. | |
| 2003/0197653 A1 | 10/2003 | Barber et al. | |
| 2003/0211652 A1 | 11/2003 | Summers | |
| 2003/0217805 A1 | 11/2003 | Takayama et al. | |
| 2003/0224248 A1 * | 12/2003 | Spiegelberg et al. | 429/178 |
| 2003/0231107 A1 | 12/2003 | Edmonson et al. | |
| 2004/0020036 A1 * | 2/2004 | Arneson et al. | 29/825 |
| 2004/0020037 A1 * | 2/2004 | Arneson et al. | 29/825 |
| 2004/0020038 A1 * | 2/2004 | Arneson et al. | 29/825 |
| 2004/0020040 A1 * | 2/2004 | Arneson et al. | 29/825 |
| 2004/0037061 A1 | 2/2004 | Liu et al. | |
| 2004/0052202 A1 | 3/2004 | Brollier | |
| 2004/0054594 A1 | 3/2004 | Forster et al. | |
| 2004/0072385 A1 * | 4/2004 | Bauer et al. | 438/68 |
| 2004/0118512 A1 * | 6/2004 | Hiller et al. | 156/302 |
| 2004/0125040 A1 | 7/2004 | Ferguson et al. | |
| 2004/0192011 A1 | 9/2004 | Roesner | |
| 2004/0203185 A1 | 10/2004 | Kerr et al. | |
| 2004/0217865 A1 | 11/2004 | Turner | |
| 2004/0250417 A1 | 12/2004 | Arneson et al. | |
| 2004/0250949 A1 | 12/2004 | Arneson et al. | |
| 2005/0005434 A1 | 1/2005 | Arneson et al. | |
| 2005/0009232 A1 | 1/2005 | Arneson et al. | |
| 2005/0015970 A1 | 1/2005 | Arneson et al. | |
| 2005/0026315 A1 | 2/2005 | Cowles et al. | |
| 2005/0040994 A1 | 2/2005 | Mazoki et al. | |
| 2005/0176170 A1 | 8/2005 | Detig | |
| 2006/0180595 A1 | 8/2006 | Arneson et al. | |
| 2006/0225273 A1 | 10/2006 | Arneson et al. | |
| 2007/0034323 A1 * | 2/2007 | Hiller et al. | 156/230 |
| 2007/0040689 A1 | 2/2007 | Reynolds | |
| 2007/0107186 A1 | 5/2007 | Arneson et al. | |
| 2007/0152901 A1 | 7/2007 | Hockey et al. | |

2008/0271313 A1 11/2008 Arneson et al.

FOREIGN PATENT DOCUMENTS

| DE | 198 05 031 C2 | 8/1999 |
| --- | --- | --- |
| DE | 198 40 226 A1 | 3/2000 |
| FR | 2 775 533 | 9/1999 |
| JP | 03-043310 | 2/1991 |
| JP | 03-212940 | 9/1991 |
| JP | 5-013990 A | 1/1993 |
| JP | 09-109582 | 4/1997 |
| JP | 2001-127415 | 5/2001 |
| JP | 2001-257222 | 9/2001 |
| JP | 2002-190003 | 7/2002 |
| JP | 2002-373917 | 12/2002 |
| KR | 2004009803 A * | 1/2004 |
| WO | WO 00/14733 A1 | 3/2000 |
| WO | WO 01/54058 A1 | 7/2001 |
| WO | WO 01/61646 A1 | 8/2001 |
| WO | WO 01/76949 A2 | 10/2001 |
| WO | WO 01/95241 A1 | 12/2001 |
| WO | WO 02/37414 A1 | 5/2002 |
| WO | WO 02/49093 A1 | 6/2002 |
| WO | WO 02/082368 A1 | 10/2002 |
| WO | PCT/US03/23792 | 7/2003 |
| WO | PCT/US03/23792 | 1/2004 |
| WO | WO 2004-012896 A1 | 2/2004 |
| WO | 2004112096 A2 | 12/2004 |

OTHER PUBLICATIONS

English Language Abstract for DE 19805031, published Aug. 19, 1999, 1 page.
English Language Abstract for DE 19840226, published Mar. 16, 2000, 1 page.
English Language Abstract for FR 2775533, published Sep. 3, 1999, 1 page.
Sarma, Sanjay, "White Paper-Towards the 5¢ Tag", Auto-ID Center, Published Nov. 1, 2001, pp. 1-19.
English Language Abstract for JP 5-013990, published Jan. 22, 1993, 1 page.
English Language Abstract for KR 2004009803, published Jan. 31, 2004, 1 page.
Annotation of 6,202,292 and 4,040,169.
"Bare-Die Feeders," http://www.delawaretechnologies.com/DTI_HTML/prd_bare_die.htm, accessed from the internet on Jul. 26, 2005, 2 pages.
"DDf—Direct Die Feeder," http://www.hoverdavis.com/Products/DDf/DDf.php, accessed from the internet on Jul. 26, 2005, 5 pages.
"Tray Feeders for Assembly Equipment (SMT/OEM)," http://www.laurierinc.com/products/baredie.htm, accessed from the internet on Jul. 26, 2005, 3 pages.
Office Action dated Aug. 21, 2006 in related U.S. Appl. No. 10/866,148.
Office Action dated Jun. 30, 2006 in related U.S. Appl. No. 10/866,148.
Office Action dated Feb. 23, 2006 in related U.S. Appl. No. 10/866,148.
Office Acton dated Jun. 24, 2005 in related U.S. Appl. No. 10/866,148.
Office Action dated Apr. 7, 2004 in related U.S. Appl. No. 10/322,702.
Office Action dated Dec. 29, 2004 in related U.S. Appl. No. 10/322,701.
Office Action dated May 28, 2004 in related U.S. Appl. No. 10/322,701.
Office Action dated Feb. 20, 2006 in related U.S. Appl. No. 10/322,467.
Office Action dated Oct. 31, 2005 in related U.S. Appl. No. 10/322,467.
Office Action dated Mar. 12, 2004 in related U.S. Appl. No. 10/322,467.
Office Action dated Mar. 18, 2008 in related U.S. Appl. No. 10/866,149.
Office Action dated Nov. 29, 2006 in related U.S. Appl. No. 10/866,149.
Office Action dated Sep. 25, 2006 in related U.S. Appl. No. 10/866,149.
Office Action dated Jul. 11, 2006 in related U.S. Appl. No. 10/866,149.
Office Action dated Mar. 15, 2006 in related U.S. Appl. No. 10/866,149.
Office Action dated May 19, 2006 in related U.S. Appl. No. 10/866,152.
Office Action dated Sep. 30, 2005 in related U.S. Appl. No. 10/866,152.
Office Action dated May 2, 2008 in related U.S. Appl. No. 10/866,253.
Office Action dated Dec. 12, 2007 in related U.S. Appl. No. 10/866,253.
Office Action dated Apr. 25, 2007 in related U.S. Appl. No. 10/866,253.
Office Action dated Dec. 28, 2006 in related U.S. Appl. No. 10/866,253.
Office Action dated Jan. 15, 2008 in related U.S. Appl. No. 10/866,151.
Office Action dated Oct. 19, 2007 in related U.S. Appl. No. 10/866,151.
Office Action dated Jan. 16, 2007 in related U.S. Appl. No. 10/866,151.
Office Action dated Oct. 27, 2006 in related U.S. Appl. No. 10/866,151.
Office Action dated Aug. 22, 2008 in related U.S. Appl. No. 11/393,887.
Office Action dated Sep. 20, 2001 in related U.S. Appl. No. 11/393,825.
PCT/US04/18577 - PCT International Search Report and Written Opinion - Mailed Jun. 15, 2006 - 6 pages.
US Office Action - Dated Oct. 6, 2005 for Related U.S. Appl. No. 10/866,148.
Steve Lewis, "Basic Introduction to RFID Technology and its use in the Supply Chain," Laran RIFD, Jan. 2004, pp. 1-31.
US Office Action - Dated Jul. 9, 2007 for Related U.S. Appl. No. 10/866,151.
US Office Action - Dated Oct. 13, 2006 for Related U.S. Appl. No. 10/866,159.
US Office Action - Dated Apr. 6, 2007 for Related U.S. Appl. No. 10/866,159.
US Office Action - Dated Oct. 16, 2007 for Related U.S. Appl. No. 10/866,159.
US Office Action - Dated Mar. 31, 2008 for Related U.S. Appl. No. 10/866,159.
US Office Action - Dated Jul. 29, 2008 for Related U.S. Appl. No. 10/866,159.
US Office Action - Dated Feb. 23, 2009 for Related U.S. Appl. No. 10/866,159.
US Office Action - Dated Oct. 14, 2009 for Related U.S. Appl. No. 12/136,565.
Japa Office Action (2005-506084) (English Translation) - Dated Jul. 17, 2009 for Related U.S. Appl. No. 11/393,825.
"Bare-Die Feeders," http://www.delawaretechnologies.com/DTI_HTML_/prd_bare_die.htm, accessed from the internet on Jul. 26, 2005, 2 pages.
"DDf - Direct Die Feeder," http://www.hoverdavis.com/Products/DDf/DDf.php, accessed from the internet on Jul. 26, 2005, 5 pages.
"Tray Feeders for Assembly Equipment (SMT/OEM)," http://www.laurierinc.com/products/baredie.htm, accessed from the internet on Jul. 26, 2005, 3 pages.
Office Action for Related U.S. Appl. No. 12/136,565 Dated Feb. 8, 2010.

* cited by examiner

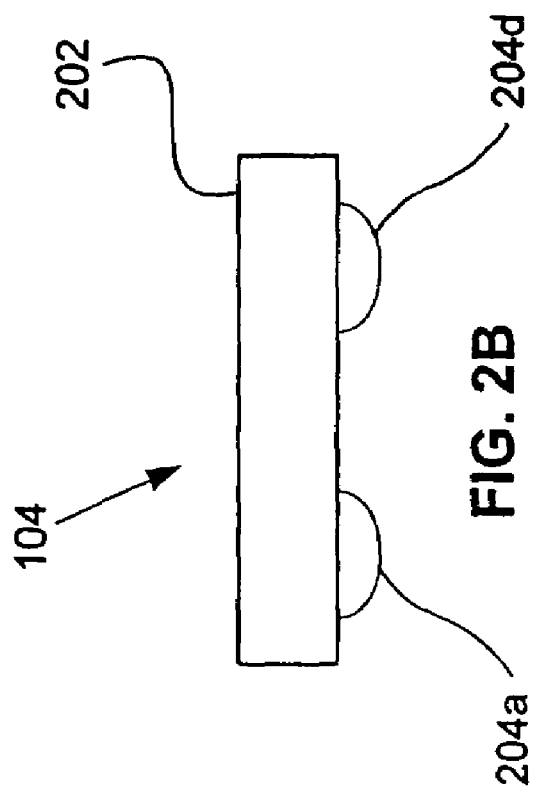
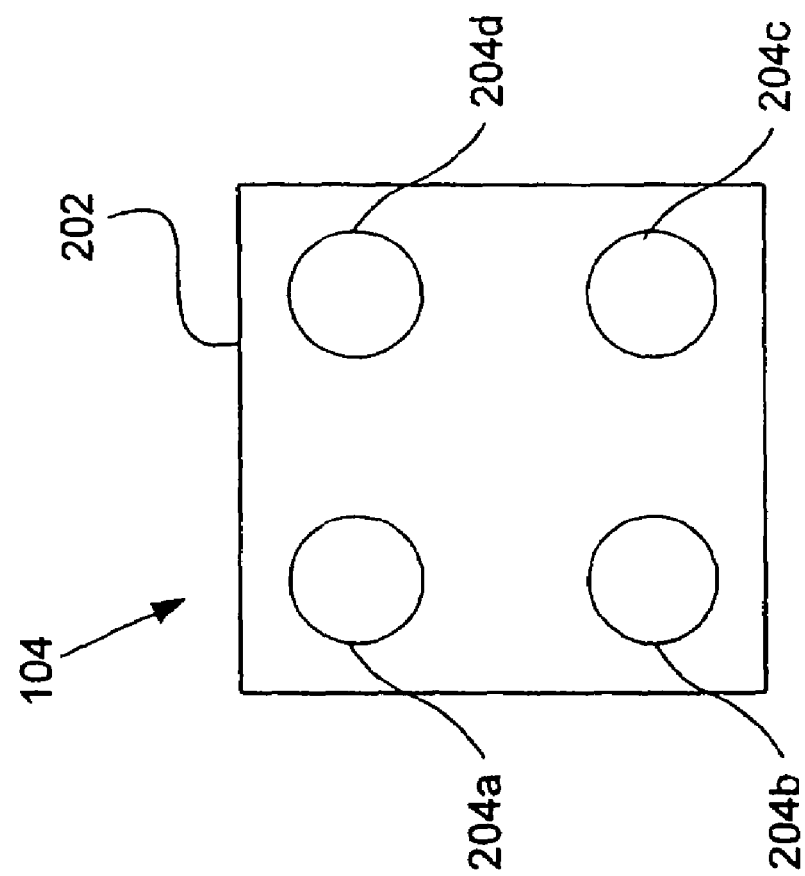

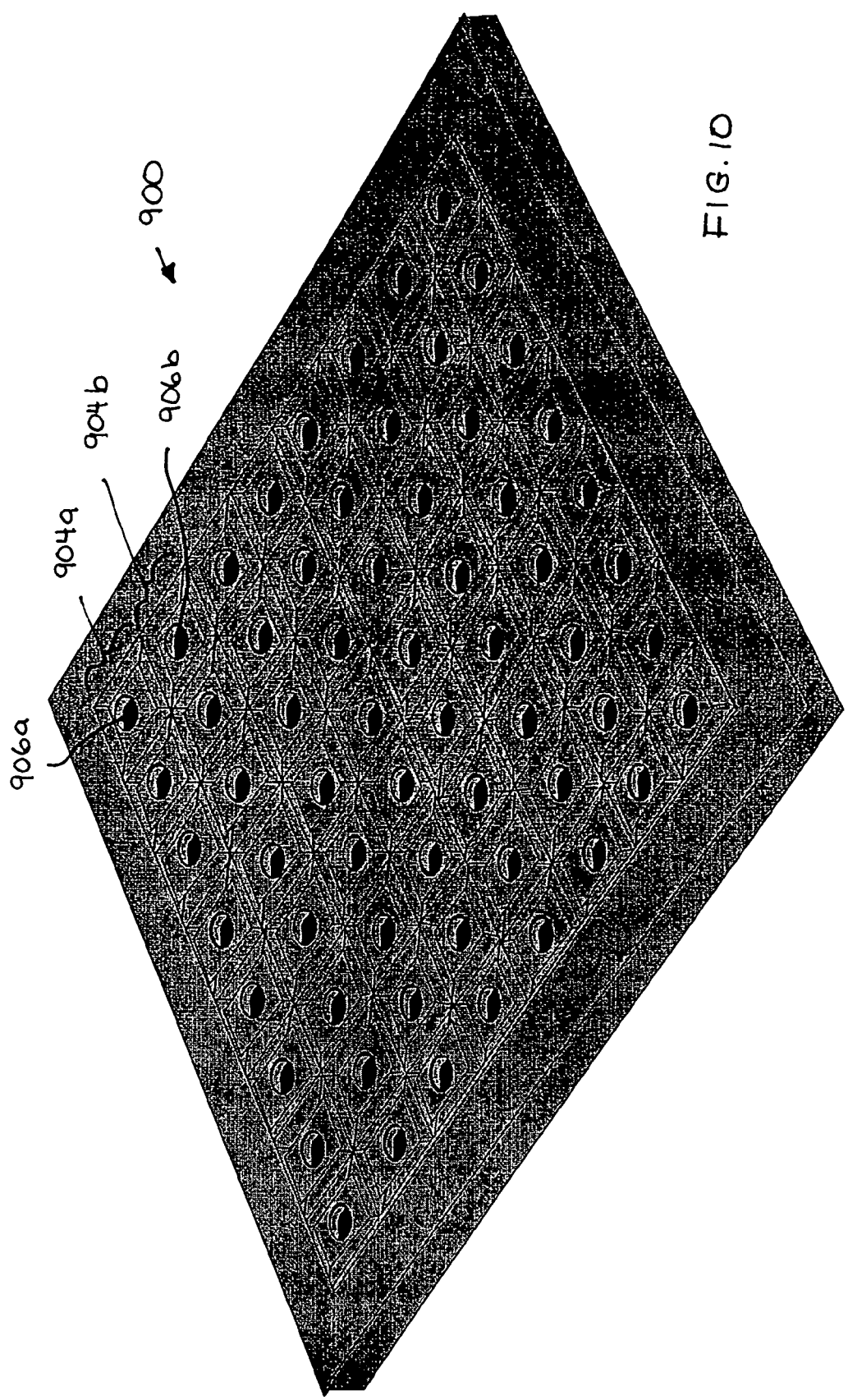

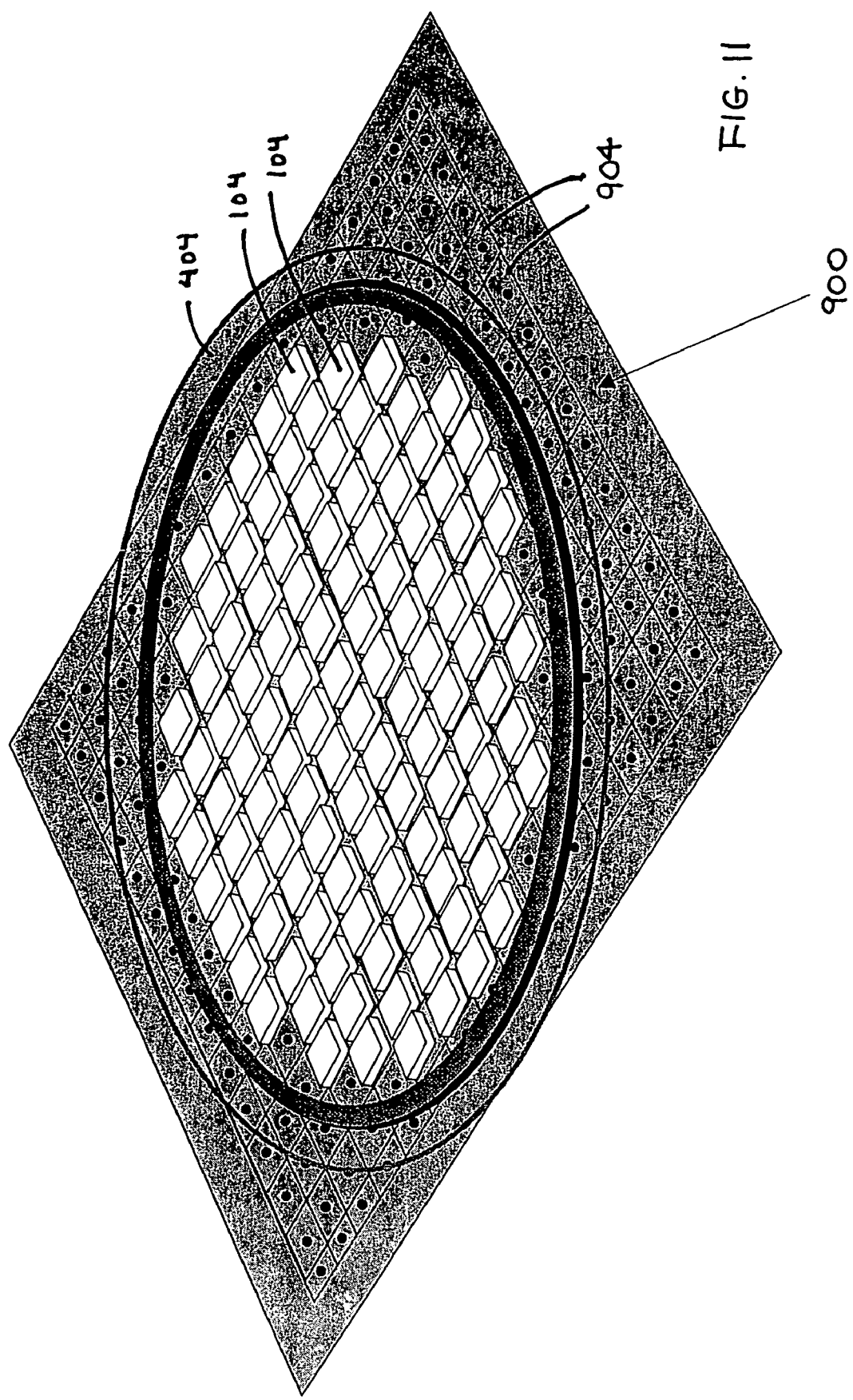

2400

2402 the support structure and die receptacle structure are positioned to be closely adjacent to each other such that each die of a plurality of dies attached to the support structure is positioned adjacent to a corresponding cell of a plurality of cells in a first surface of the die receptacle structure

2404 a suction is applied at a second surface of the die receptacle structure so that at least a partial vacuum exists in each cell of the plurality of cells due to a hole in the second surface corresponding to each cell

2406 the applied suction is allowed to cause the sharp portions of the die receptacle structure to cut the support structure around each die of the plurality of dies, such that each die of the plurality of dies is separated from the support structure and is transferred into the corresponding cell of the plurality of cells by the applied suction

2802 the support structure and die receptacle structure are positioned to be closely adjacent to each other such that each die of a plurality of dies attached to the support structure is positioned in a corresponding cell of a plurality of cells in a first surface of the die receptacle structure

2804 each die of the plurality of dies is released from the support structure so that each die resides in the corresponding cell of the plurality of cells

FIG. 28

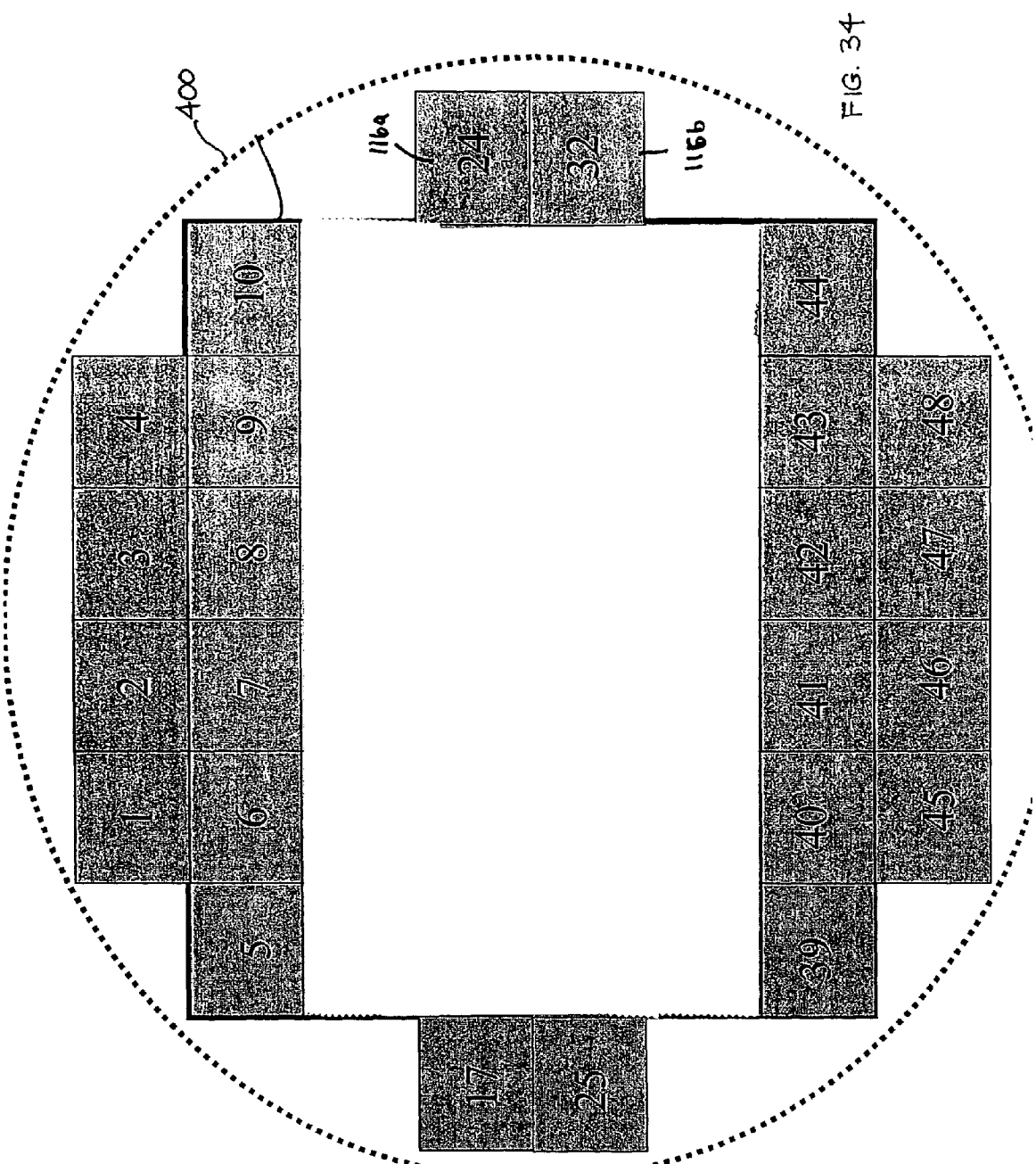

METHOD, SYSTEM, AND APPARATUS FOR TRANSFER OF DIES USING A DIE PLATE HAVING DIE CAVITIES

CROSS-REFERENCE TO RELATED APPLICATIONS

This application claims the benefit of U.S. Provisional Application No. 60/477,735, filed Jun. 12, 2003, which is herein incorporated by reference in its entirety.

The following applications of common assignee are related to the present application, have the same filing date as the present application, and are herein incorporated by reference in their entireties:

"Method And Apparatus For Expanding A Semiconductor Wafer," U.S. Ser. No. 10/866,148;

"Method, System, And Apparatus For Authenticating Devices During Assembly," U.S. Ser. No. 10/866,152;

"Method, System, And Apparatus For Transfer Of Dies Using A Die Plate," U.S. Ser. No. 10/866,253;

"Method, System, And Apparatus For High Volume Transfer Of Dies," U.S. Ser. No. 10/866,149; and "Method, System, And Apparatus For High Volume Assembly Of Compact Discs And Digital Video Discs Incorporating Radio Frequency Identification Tag Technology," U.S. Ser. No. 10/866,151.

The following applications of common assignee are related to the present application, and are herein incorporated by reference in their entireties:

"Method and Apparatus for High Volume Assembly of Radio Frequency Identification Tags," U.S. Provisional App. No. 60/400,101, filed Aug. 2, 2002;

"Method and Apparatus for High Volume Assembly of Radio Frequency Identification Tags," Ser. No. 10/322,467, filed Dec. 19, 2002;

"Multi-Barrel Die Transfer Apparatus and Method for Transferring Dies Therewith," Ser. No. 10/322,718, filed Dec. 19, 2002;

"Die Frame Apparatus and Method of Transferring Dies Therewith," Ser. No. 10/322,701, filed Dec. 19, 2002;

"System and Method of Transferring Dies Using an Adhesive Surface," Ser. No. 10/322,702, filed Dec. 19, 2002; and "Method and System for Forming a Die Frame and for Transferring Dies Therewith," Ser. No. 10/429,803, filed May 6, 2003.

BACKGROUND OF THE INVENTION

1. Field of the Invention

The present invention relates generally to the assembly of electronic devices. More particularly, the present invention relates to the transfer of dies from wafers to substrates, including substrates of radio frequency identification (RFID) tags.

2. Related Art

Pick and place techniques are often used to assemble electronic devices. Such techniques involve a manipulator, such as a robot arm, to remove integrated circuit (IC) dies from a wafer and place them into a die carrier. The dies are subsequently mounted onto a substrate with other electronic components, such as antennas, capacitors, resistors, and inductors to form an electronic device.

Pick and place techniques involve complex robotic components and control systems that handle only one die at a time. This has a drawback of limiting throughput volume. Furthermore, pick and place techniques have limited placement accuracy, and have a minimum die size requirement.

One type of electronic device that may be assembled using pick and place techniques is an RFID "tag." An RFID tag may be affixed to an item whose presence is to be detected and/or monitored. The presence of an RFID tag, and therefore the presence of the item to which the tag is affixed, may be checked and monitored by devices known as "readers."

As market demand increases for products such as RFID tags, and as die sizes shrink, high assembly throughput rates for very small die, and low production costs are crucial in providing commercially-viable products. Accordingly, what is needed is a method and apparatus for high volume assembly of electronic devices, such as RFID tags, that overcomes these limitations.

SUMMARY OF THE INVENTION

The present invention is directed to methods, systems, and apparatuses for producing one or more electronic devices, such as RFID tags, that each include a die having one or more electrically conductive contact pads that provide electrical connections to related electronics on a substrate.

According to the present invention, electronic devices are formed at much greater rates than conventionally possible. In one aspect, large quantities of dies can be transferred directly from a wafer to corresponding substrates of a web of substrates. In another aspect, large quantities of dies can be transferred from a support surface to corresponding substrates of a web of substrates. In another aspect, large quantities of dies can be transferred from a wafer or support surface to an intermediate surface, such as a die plate. The die plate may have cells formed in a surface thereof in which the dies reside. Otherwise, the dies can reside on a surface of the die plate. The dies of the die plate can then be transferred to corresponding substrates of a web of substrates.

In an aspect, a punch plate, punch roller or cylinder, or expandable material can be used to transfer dies from the die plate to substrates.

Large quantities of dies can be transferred. For example, 10s, 100s, 1000s, or more dies, or even all dies of a wafer, support surface, or die plate, can be simultaneously transferred to corresponding substrates of a web.

In one aspect, dies may be transferred between surfaces in a "pads up" orientation. When dies are transferred to a substrate in a "pads up" orientation, related electronics can be printed or otherwise formed to couple contact pads of the die to related electronics of the tag substrate.

In an alternative aspect, the dies may be transferred between surfaces in a "pads down" orientation. When dies are transferred to a substrate in a "pads down" orientation, related electronics can be pre-printed or otherwise pre-deposited on the tag substrates.

In an aspect, untransferred dies on a die plate can be recovered. When dies remain on a die plate after the transfer process is complete, the remaining dies are transferred into a die receptacle structure. The die receptacle structure can then be used as a die plate in a subsequent transfer process.

These and other advantages and features will become readily apparent in view of the following detailed description of the invention.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 1A shows a block diagram of an exemplary RFID tag, according to an embodiment of the present invention.

FIGS. 2A and 2B show plan and side views of an exemplary die, respectively.

FIG. 10 shows a perspective view of a die receptacle structure, according to an example embodiment of the present invention.

FIG. 11 shows a perspective view showing a plurality of dies attached to a support structure being aligned over a die receptacle structure, according to an embodiment of the present invention.

FIG. 24 shows a flowchart providing example steps for transferring dies from a support structure to a die receptacle structure, according to embodiments of the present invention.

FIG. 28 shows a flowchart providing example steps for transferring dies from a support structure to a die receptacle structure, according to embodiments of the present invention.

FIG. 34 shows an exemplary wafer having a plurality of dies remaining after the transfer step is completed.

Figure 1A:
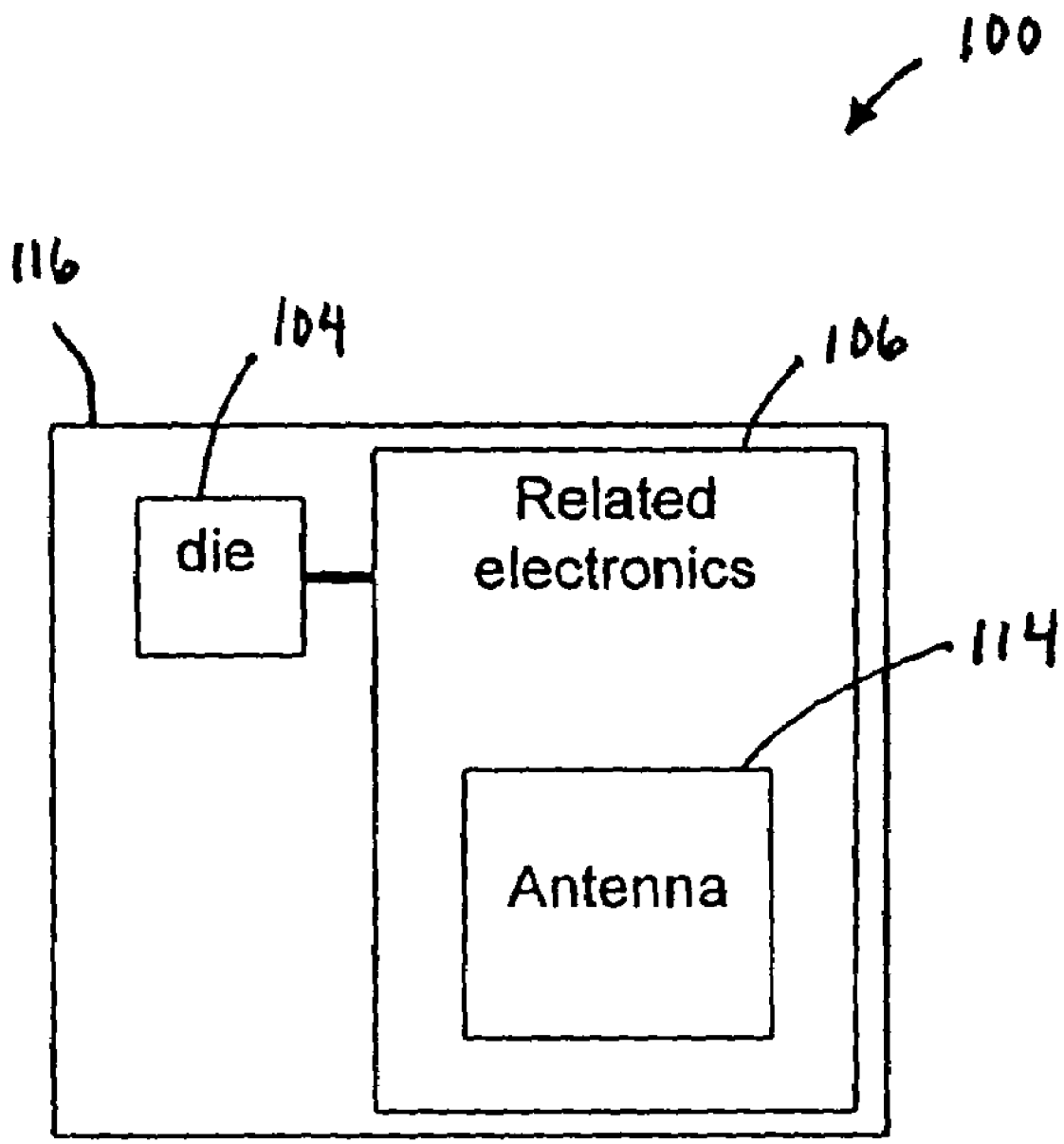
FIGS. 1B and 1C show detailed views of exemplary RFID tags, according to embodiments of the present invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

1. Overview

The present invention provides improved processes and systems for assembling electronic devices, including RFID tags. The present invention provides improvements over current processes. Conventional techniques include vision-based systems that pick and place dies one at a time onto substrates. The present invention can transfer multiple dies simultaneously. Vision-based systems are limited as far as the size of dies that may be handled, such as being limited to dies larger than 600 microns square. The present invention is applicable to dies 100 microns square and even smaller. Furthermore, yield is poor in conventional systems, where two or more dies may be accidentally picked up at a time, causing losses of additional dies. The present invention allows for improved yield values.

The present invention provides an advantage of simplicity. Conventional die transfer tape mechanisms may be used by the present invention. Furthermore, much higher fabrication rates are possible. Current techniques process 5-8 thousand units per hour. The present invention can provide improvements in these rates by a factor of N. For example, embodiments of the present invention can process dies 5 times as fast as conventional techniques, at 100 times as fast as conventional techniques, and at even faster rates. Furthermore, because the present invention allows for flip-chip die attachment techniques, wire bonds are not necessary.

Elements of the embodiments described herein may be combined in any manner. Example RFID tags are described in section 1.1. Assembly embodiments for devices are described in section 1.2.

1.1 Exemplary Electronic Device

The present invention is directed to techniques for producing electronic devices, such as RFID tags. For illustrative purposes, the description herein primarily relates to the production of RFID tags. However, the invention is also adaptable to the production of further electronic device types, as would be understood by persons skilled in the relevant art(s) from the teachings herein.

Figure 1B:
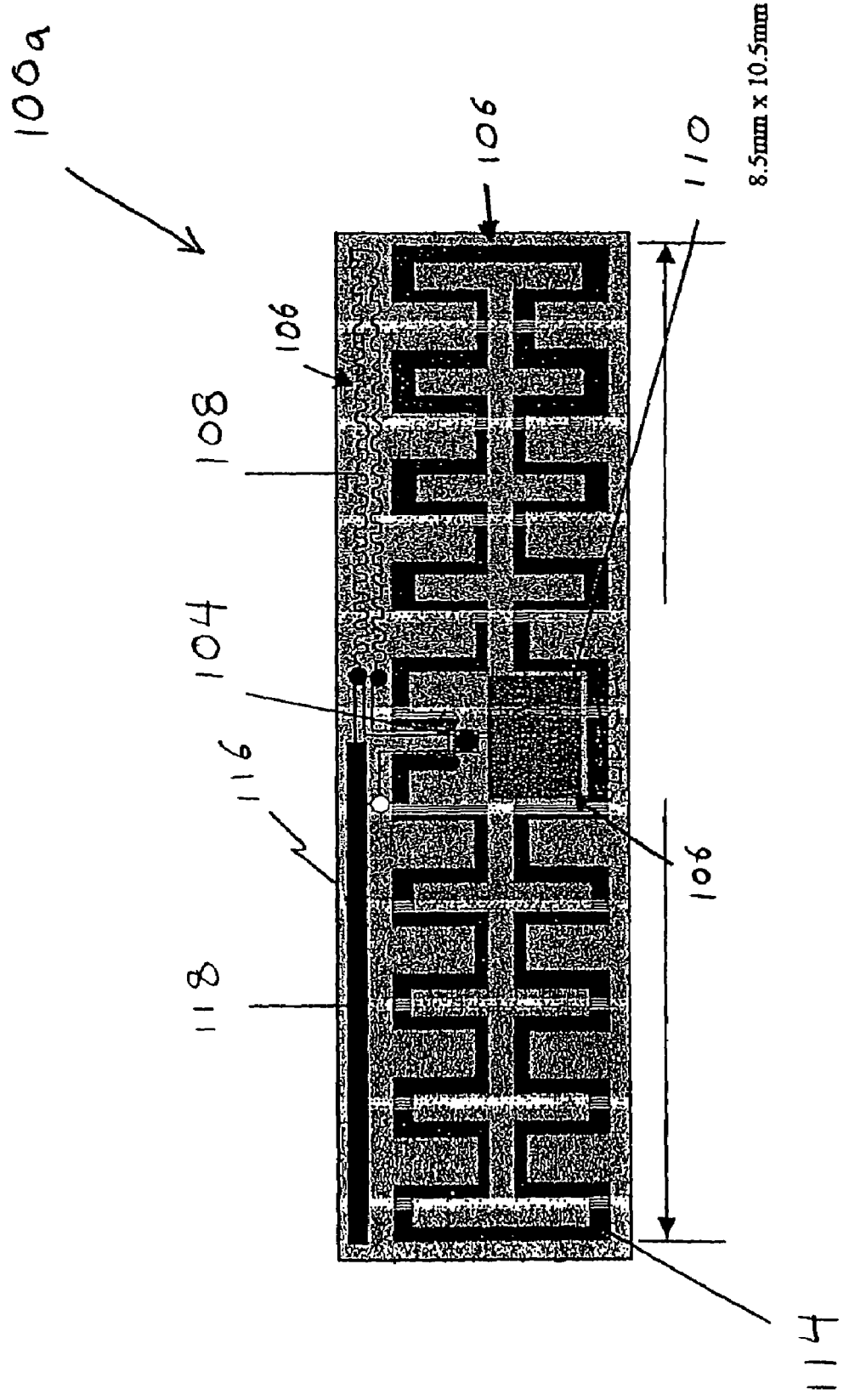
Figure 1C:
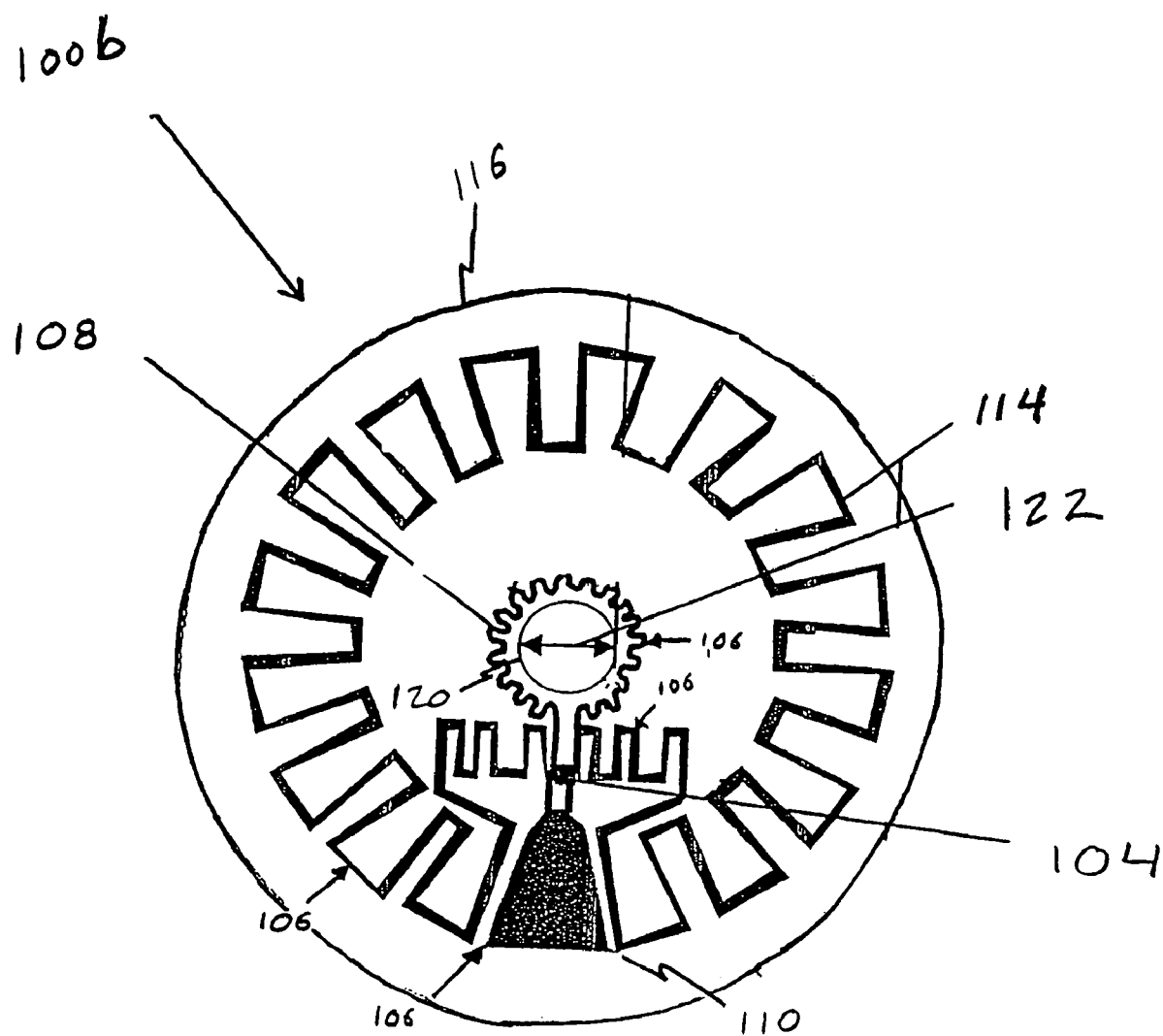

FIG. 1A shows a block diagram of an exemplary RFID tag 100, according to an embodiment of the present invention. As shown in FIG. 1A, RFID tag 100 includes a die 104 and related electronics 106 located on a tag substrate 116. Related electronics 106 includes an antenna 114 in the present example. FIGS. 1B and 1C show detailed views of exemplary RFID tags 100, indicated as RFID tags 100a and 100b. As shown in FIGS. 1B and 1C, die 104 can be mounted onto antenna 114 of related electronics 106. As is further described elsewhere herein, die 104 may be mounted in either a pads up or pads down orientation.

FIG. 1B depicts an exemplary tag 100A having a rectangular substrate 116. As shown in FIG. 1B, the exemplary antenna 114 on substrate 116 extends for 50.75 mm in the x direction and 19 mm in the y direction. As would be appreciated by persons skilled in the art, different dimensions and configurations can be used for antenna 114 and substrate 116.

FIG. 1C depicts an exemplary tag 100B having a circular substrate 116. Exemplary antenna 114 on substrate 116 also has a substantially circular geometry. As shown in FIG. 1C, exemplary antenna 114 fits within a circle having a diameter of approximately 35 mm.

RFID tag 100, such as the exemplary tags shown in FIGS. 1A-1C, may be located in an area having a large number, population, or pool of RFID tags present. RFID tag 100 receives interrogation signals transmitted by one or more tag readers. According to interrogation protocols, RFID tag 100 responds to these signals. Each response includes information that identifies the corresponding RFID tag 100 of the potential pool of RFID tags present. Upon reception of a response, the tag reader determines the identity of the responding tag, thereby ascertaining the existence of the tag within a coverage area defined by the tag reader.

RFID tag 100 may be used in various applications, such as inventory control, airport baggage monitoring, as well as security and surveillance applications. Thus, RFID tag 100 can be affixed to items such as airline baggage, retail inventory, warehouse inventory, automobiles, compact discs (CDs), digital video discs (DVDs), video tapes, and other objects. RFID tag 100 enables location monitoring and real time tracking of such items.

In the present embodiment, die 104 is an integrated circuit that performs RFID operations, such as communicating with one or more tag readers (not shown) according to various interrogation protocols. Exemplary interrogation protocols are described in U.S. Pat. No. 6,002,344 issued Dec. 14, 1999 to Bandy et al. entitled System and Method for Electronic Inventory, and U.S. patent application Ser. No. 10/072,885, filed on Feb. 12, 2002, both of which are incorporated by reference herein in its entirety. Die 104 includes a plurality of contact pads that each provide an electrical connection with related electronics 106.

Related electronics 106 are connected to die 104 through a plurality of contact pads of IC die 104. In embodiments, related electronics 106 provide one or more capabilities, including RF reception and transmission capabilities, sensor functionality, power reception and storage functionality, as well as additional capabilities. The components of related electronics 106 can be printed onto a tag substrate 116 with materials, such as conductive inks. Examples of conductive inks include silver conductors 5000, 5021, and 5025, produced by DuPont Electronic Materials of Research Triangle Park, N.C. Other materials or means suitable for printing related electronics 106 onto tag substrate 116 include polymeric dielectric composition 5018 and carbon-based PTC resistor paste 7282, which are also produced by DuPont Electronic Materials of Research Triangle Park, N.C. Other materials or means that may be used to deposit the component material onto the substrate would be apparent to persons skilled in the relevant art(s) from the teachings herein.

As shown in FIGS. 1A-1C, tag substrate 116 has a first surface that accommodates die 104, related electronics 106, as well as further components of tag 100. Tag substrate 116 also has a second surface that is opposite the first surface. An adhesive material or backing can be included on the second surface. When present, the adhesive backing enables tag 100 to be attached to objects, such as books and consumer products. Tag substrate 116 is made from a material, such as polyester, paper, plastic, fabrics such as cloth, and/or other materials such as commercially available Tyvec®.

In some implementations of tags 100, tag substrate 116 can include an indentation, "cavity," or "cell" (not shown in FIGS. 1A-1C) that accommodates die 104. An example of such an implementation is included in a "pads up" orientation of die 104.

FIGS. 2A and 2B show plan and side views of an example die 104. Die 104 includes four contact pads 204a-d that provide electrical connections between related electronics 106 (not shown) and internal circuitry of die 104. Note that although four contact pads 204a-d are shown, any number of contact pads may be used, depending on a particular application. Contact pads 204 are made of an electrically conductive material during fabrication of the die. Contact pads 204 can be further built up if required by the assembly process, by the deposition of additional and/or other materials, such as gold and solder flux. Such post processing, or "bumping," will be known to persons skilled in the relevant art(s).

Figure 2C:
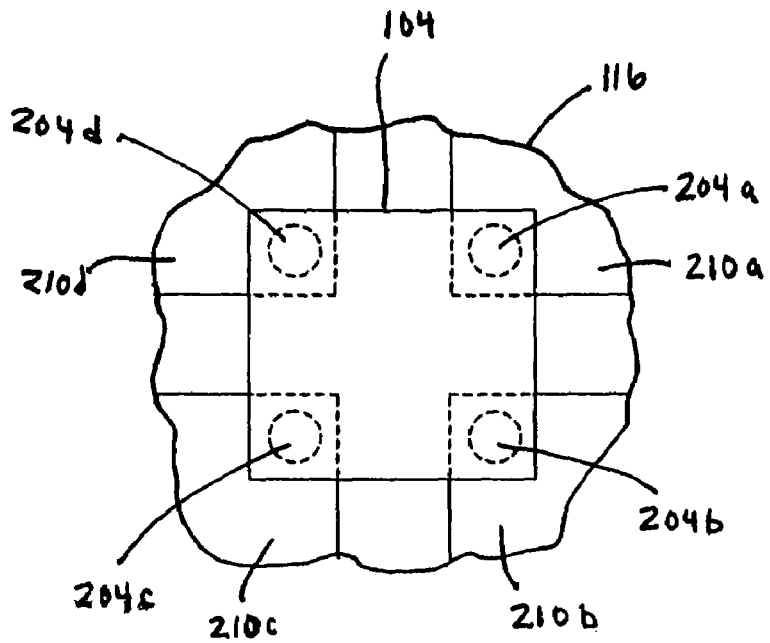
FIGS. 2C and 2D show portions of a substrate with a die attached thereto, according to example embodiments of the present invention.
Figure 2D:
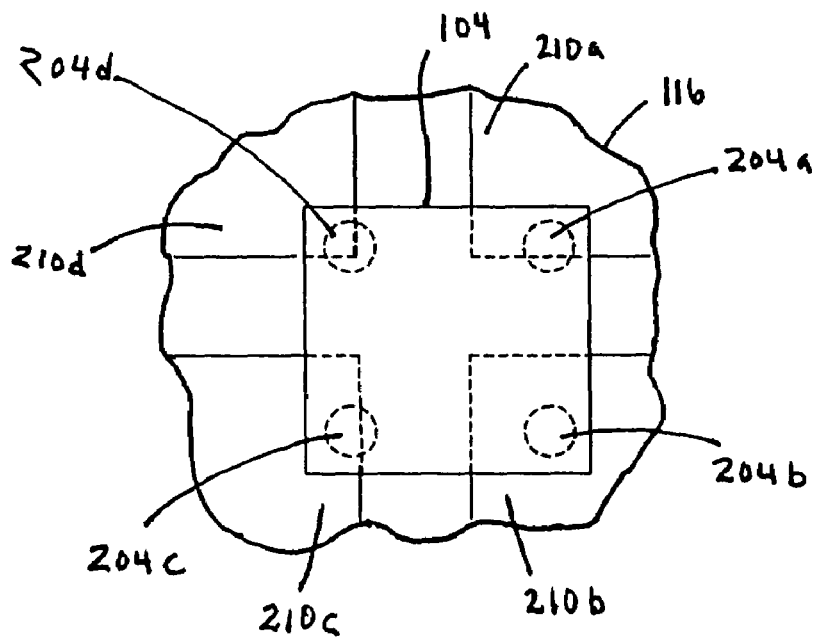

FIG. 2C shows a portion of a substrate 116 with die 104 attached thereto, according to an example embodiment of the present invention. As shown in FIG. 2C, contact pads 204a-d of die 104 are coupled to respective contact areas 210a-d of substrate 116. Contact areas 210a-d provide electrical connections to related electronics 106. The arrangement of contact pads 204a-d in a rectangular (e.g., square) shape allows for flexibility in attachment of die 104 to substrate 116, and good mechanical adherement. This arrangement allows for a range of tolerance for imperfect placement of IC die 104 on substrate 116, while still achieving acceptable electrical coupling between contact pads 204a-d and contact areas 210a-d. For example, FIG. 2D shows an imperfect placement of IC die 104 on substrate 116. However, even though IC die 104 has been improperly placed, acceptable electrical coupling is achieved between contact pads 204a-d and contact areas 210a-d.

Note that although FIGS. 2A-2D show the layout of four contact pads 204a-d collectively forming a rectangular shape, greater or lesser numbers of contact pads 204 may be used. Furthermore, contact pads 204a-d may be laid out in other shapes in other embodiments.

1.2 Device Assembly

The present invention is directed to continuous-roll assembly techniques and other techniques for assembling electronic devices, such as RFID tag 100. Such techniques involve a continuous web (or roll) of the material of the substrate 116 that is capable of being separated into a plurality of devices. Alternatively, separate sheets of the material can be used as discrete substrate webs that can be separated into a plurality of devices. As described herein, the manufactured one or more devices can then be post processed for individual use. For illustrative purposes, the techniques described herein are made with reference to assembly of tags, such as RFID tag 100. However, these techniques can be applied to other tag implementations and other suitable devices, as would be apparent to persons skilled in the relevant art(s) from the teachings herein.

The present invention advantageously eliminates the restriction of assembling electronic devices, such as RFID tags, one at a time, allowing multiple electronic devices to be assembled in parallel. The present invention provides a continuous-roll technique that is scalable and provides much higher throughput assembly rates than conventional pick and place techniques.

Figure 3:
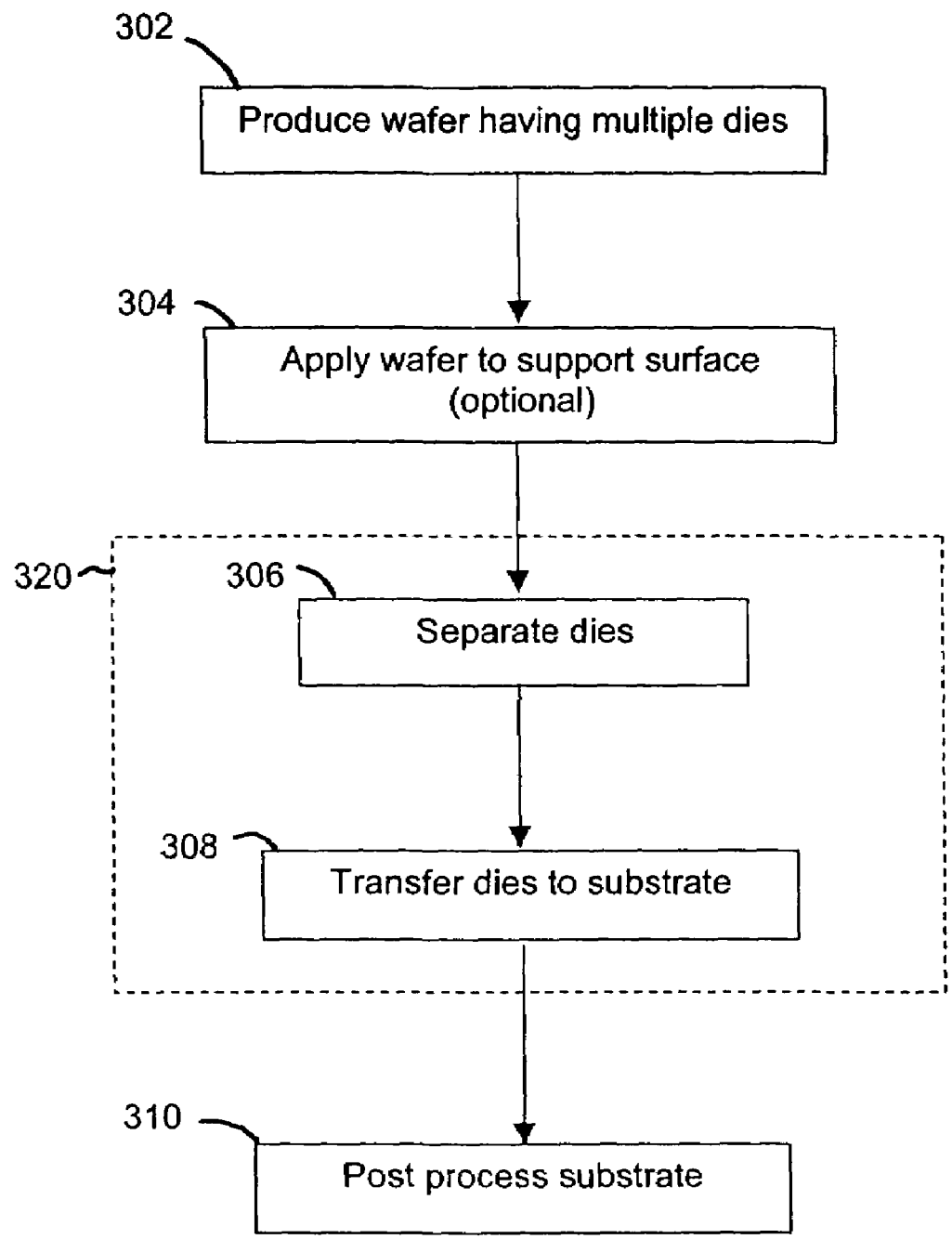
FIG. 3 is a flowchart illustrating a device assembly process, according to embodiments of the present invention.

FIG. 3 shows a flowchart 300 with example steps relating to continuous-roll production of RFID tags 100, according to example embodiments of the present invention. FIG. 3 shows a flowchart illustrating a process 300 for assembling tags 100. The process 300 depicted in FIG. 3 is described with continued reference to FIGS. 4A and 4B. However, process 300 is not limited to these embodiments.

Figure 4A:
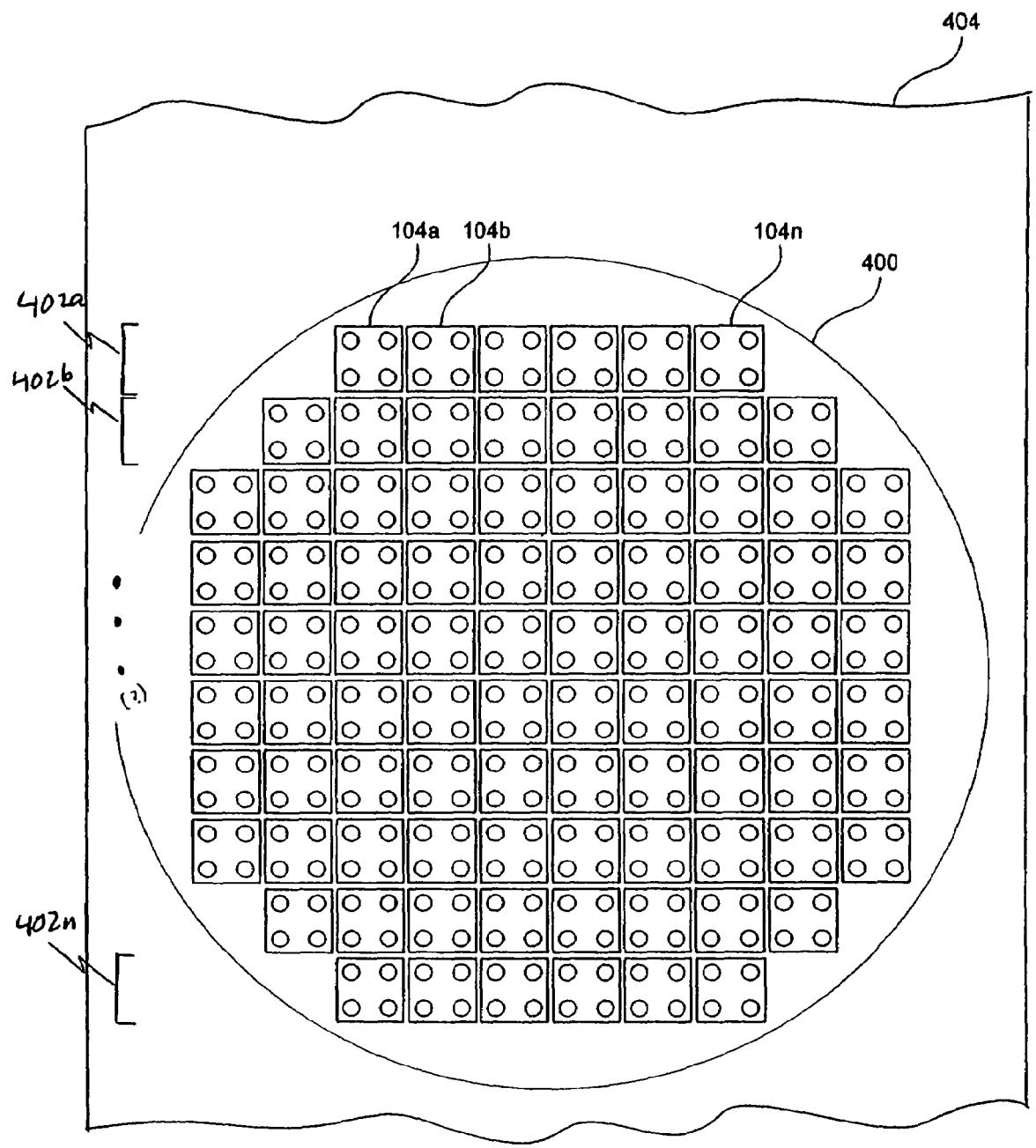
FIGS. 4A and 4B are plan and side views of a wafer having multiple dies affixed to a support surface, respectively.

Process 300 begins with a step 302. In step 302, a wafer 400 (shown in FIG. 4A) having a plurality of dies 104 is produced. FIG. 4A illustrates a plan view of an exemplary wafer 400. As illustrated in FIG. 4A, a plurality of dies 104a-n are arranged in a plurality of rows 402a-n.

Figure 4B:
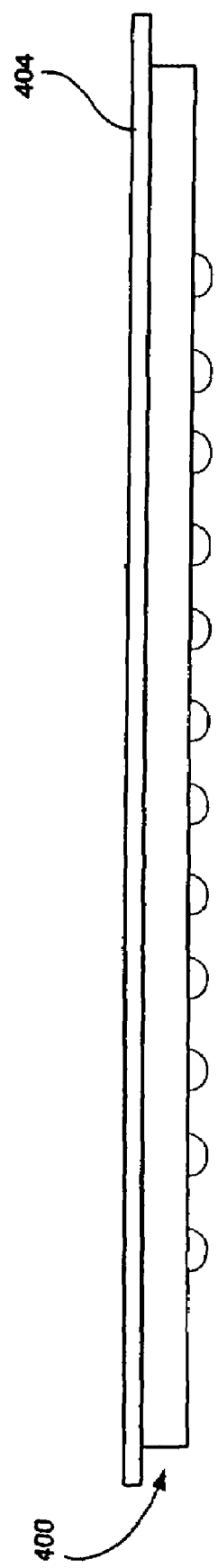

In a step 304, wafer 400 is optionally applied to a support structure or surface 404. Support surface 404 includes an adhesive material to provide adhesiveness. For example, support surface 404 may be an adhesive tape that holds wafer 400 in place for subsequent processing. FIG. 4B shows an example view of wafer 400 in contact with an example support surface 404. In some embodiments, wafer 400 is not attached to a support surface, and can be operated on directly.

Figure 5:
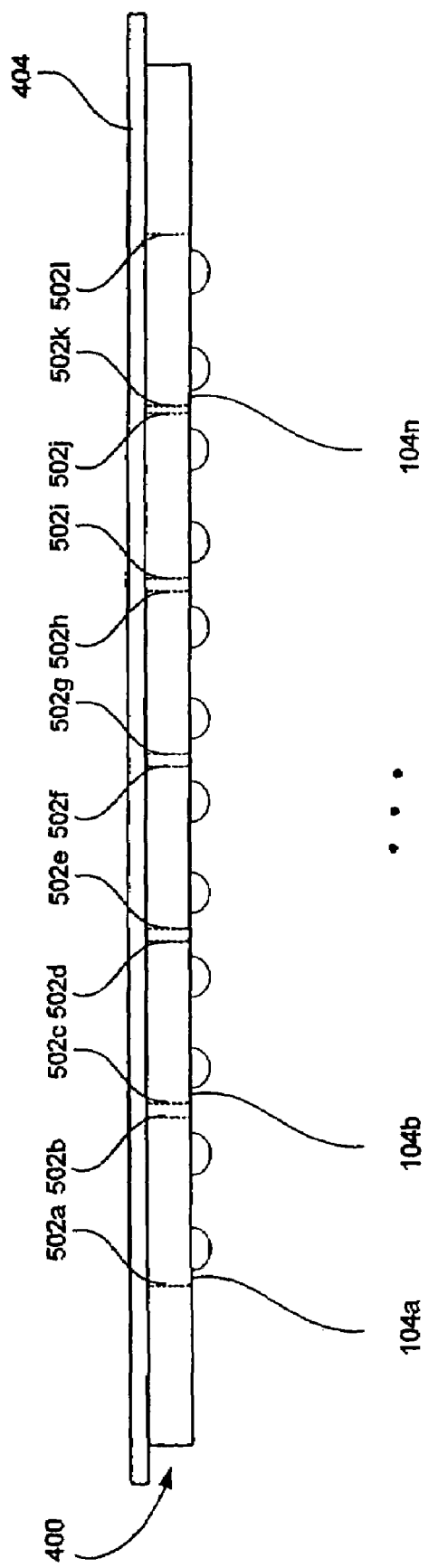
FIG. 5 is a view of a wafer having separated dies affixed to a support surface.

In a step 306, the plurality of dies 104 on wafer 400 are separated. For example, step 306 may include scribing wafer 400 according to a process, such as laser etching. FIG. 5 shows a view of wafer 400 having example separated dies 104 that are in contact with support surface 404. FIG. 5 shows a plurality of scribe lines 502a-l that indicate locations where dies 104 are separated.

In a step 308, the plurality of dies 104 is transferred to a substrate. For example, dies 104 can be transferred from support surface 404 to tag substrates 116. Alternatively, dies 104 can be directly transferred from wafer 400 to substrates 116. In an embodiment, step 308 may allow for "pads down" transfer. Alternatively, step 308 may allow for "pads up" transfer. As used herein the terms "pads up" and "pads down" denote alternative implementations of tags 100. In particular, these terms designate the orientation of connection pads 204 in relation to tag substrate 116. In a "pads up" orientation for tag 100, die 104 is transferred to tag substrate 116 with pads 204a-204d facing away from tag substrate 116. In a "pads down" orientation for tag 100, die 104 is transferred to tag substrate 116 with pads 204a-204d facing towards, and in contact with tag substrate 116.

Note that step 308 may include multiple die transfer iterations. For example, in step 308, dies 104 may be directly transferred from a wafer 400 to substrates 116. Alternatively, dies 104 may be transferred to an intermediate structure, and subsequently transferred to substrates 116. Example embodiments of such die transfer options are described below in reference to FIGS. 6-8.

Note that steps 306 and 308 can be performed simultaneously in some embodiments. This is indicated in FIG. 3 by step 320, which includes both of steps 306 and 308.

Example embodiments of the steps of flowchart 300, are described in co-pending applications, "Method and Apparatus for Expanding a Semiconductor Wafer," U.S. Ser. No. 10/866,148, "Method, System, and Apparatus for Transfer of Dies Using a Die Plate Having Die Cavities," U.S. Ser. No. 10/866,150, "Method, System, and Apparatus for Transfer of Dies Using a Die Plate," U.S. Ser. No. 10/866,253, "Method, System, and Apparatus for Transfer of Dies Using a Pin Plate," U.S. Ser. No. 10/866,159, and "Method, System, and Apparatus for High Volume Transfer of Dies," U.S. Ser. No. 10/866,149, each of which is herein incorporated by reference in its entirety.

In a step 310, post processing is performed. For example, during step 310, assembly of device(s) 100 is completed.

Figure 6:
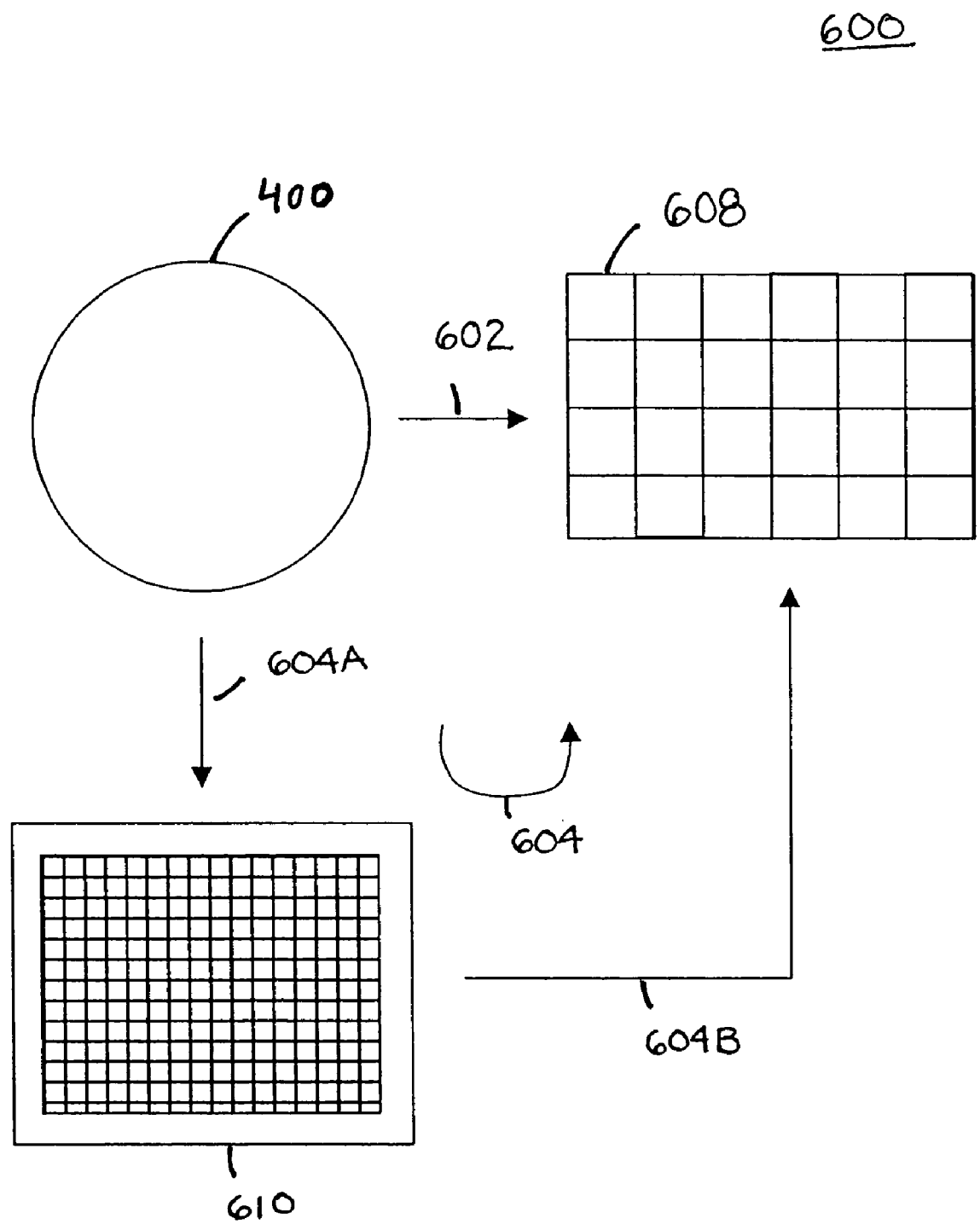
FIG. 6 shows a system diagram illustrating example options for transfer of dies from wafers to substrates, according to embodiments of the present invention.
Figure 7:
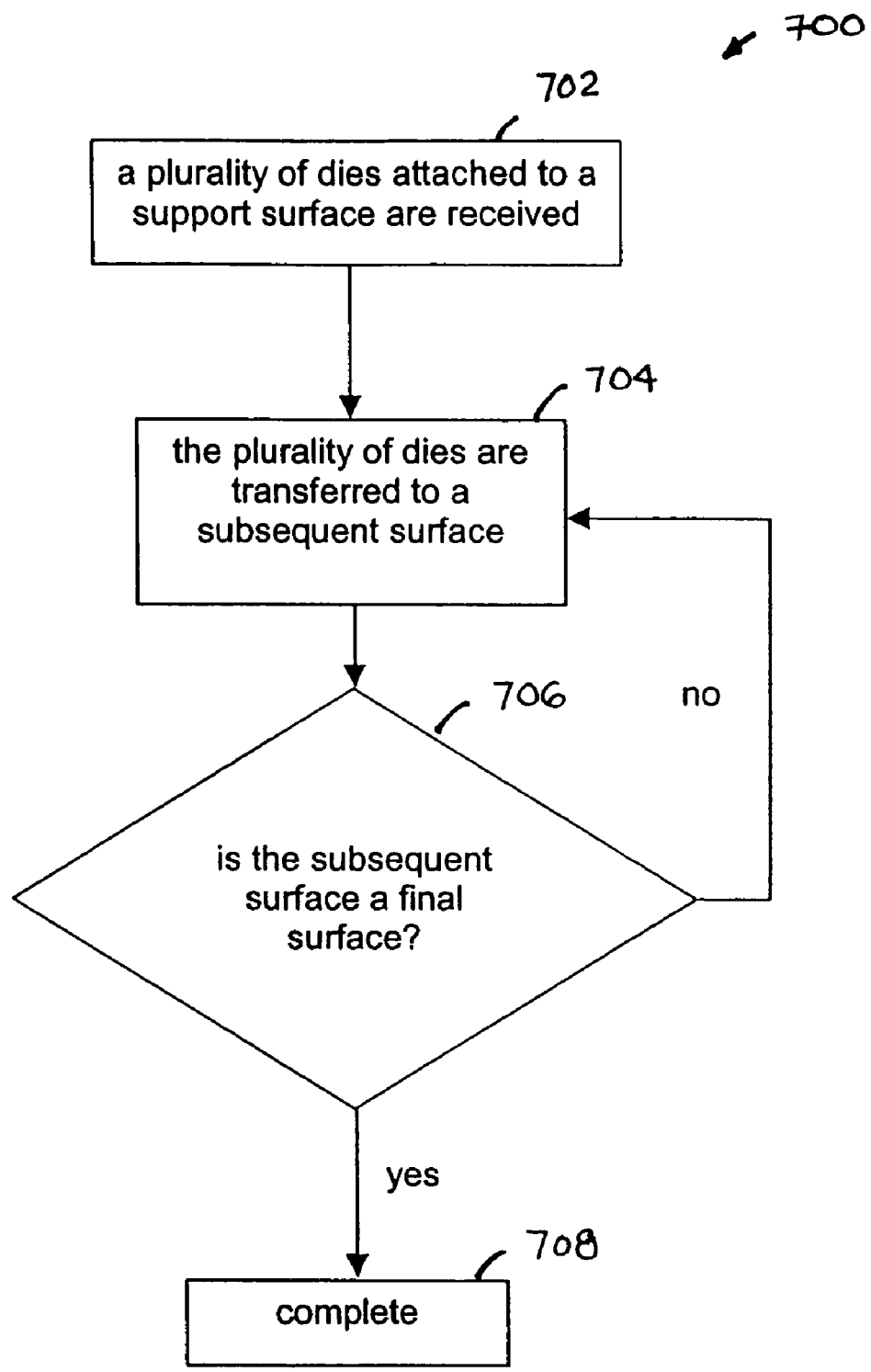
FIGS. 7 and 8 show flowcharts providing steps for transferring dies from a first surface to a second surface, according to embodiments of the present invention.
Figure 8:
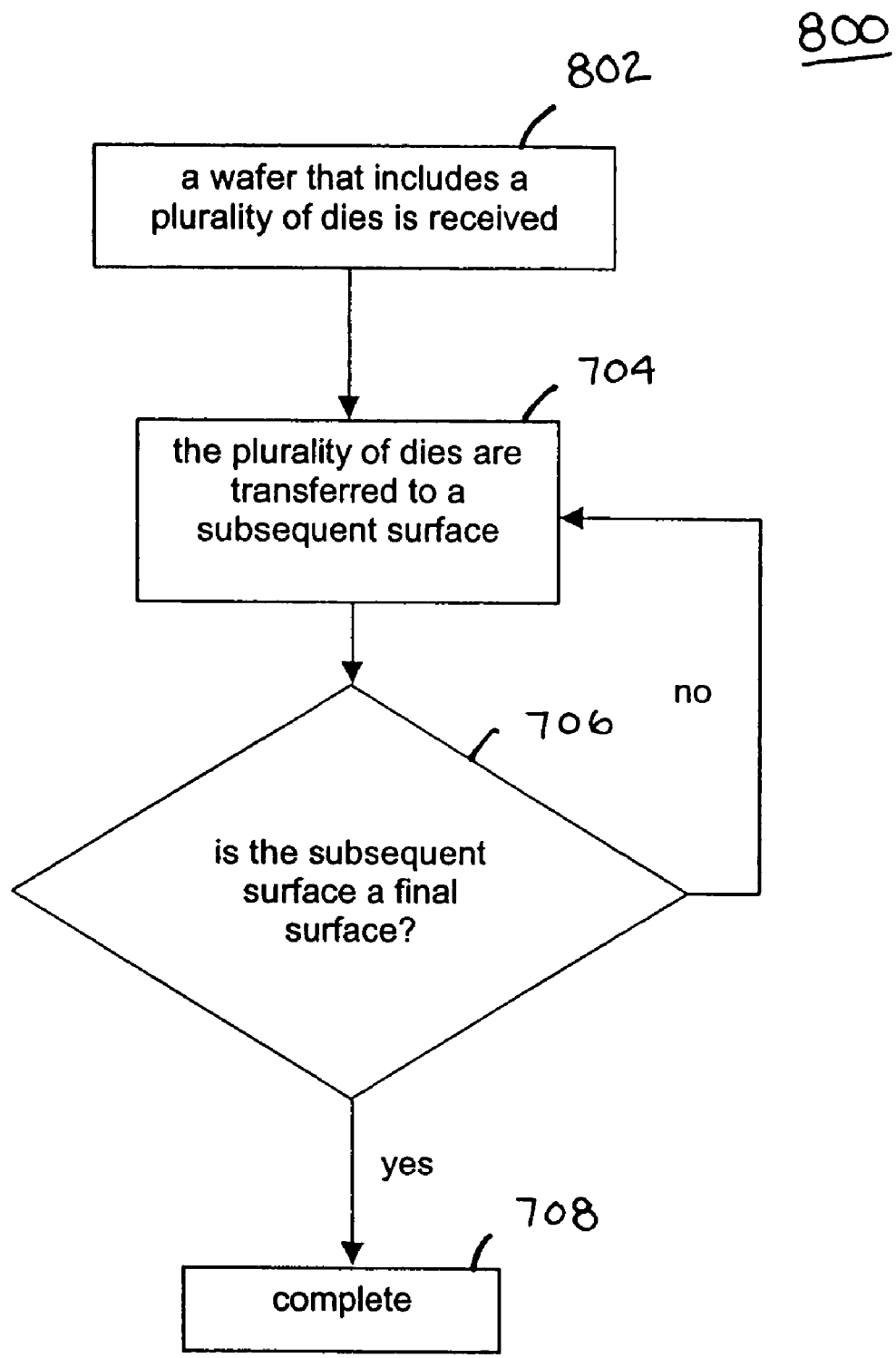

FIGS. 6-8 further describe step 308 of FIG. 3. FIG. 6 shows a high-level system diagram 600 that provides a representation of the different modes or paths of transfer of dies from wafers to substrates. FIG. 6 shows a wafer 400, a substrate web 608, and a transfer surface 610. Two paths are shown in FIG. 6 for transferring dies, a first path 602, which is a direct path, and a second path 604, which is a path having intermediate steps.

For example, as shown in FIG. 6, first path 602 leads directly from wafer 400 to substrate web 608. In other words, dies can be transferred from wafer 400 to substrates of substrate web 608 directly, without the dies having first to be transferred from wafer 400 to another surface or storage structure. However, as shown in path 604, at least two steps are required, path 604A and path 604B. For path 604A, dies are first transferred from wafer 400 to an intermediate transfer surface 610. The dies then are transferred from transfer surface 610 via path 604B to the substrates of web 608. Paths 602 and 604 each have their advantages. For example, path 602 can have fewer steps than path 604, but can have issues of die registration, and other difficulties. Path 604 typically has a larger number of steps than path 602, but transfer of dies from wafer 400 to a transfer surface 610 can make die transfer to the substrates of web 808 easier, as die registration may be easier.

FIGS. 7 and 8 show flowcharts providing steps for transferring dies from a first surface to a second surface, according to embodiments of the present invention. Structural embodiments of the present invention will be apparent to persons skilled in the relevant art(s) based on the following discussion. These steps are described in detail below.

Flowchart 700 begins with step 702. In step 702, a plurality of dies attached to a support surface is received. For example, the dies are dies 104, which are shown attached to a support surface 404 as shown in FIG. 4A. For example, support surface 404 can be a "green tape" or "blue tape" as would be known to persons skilled in the relevant art(s).

In step 704, the plurality of dies are transferred to a subsequent surface. For example, dies 104 may be transferred by an adhesive tape, a punch tape, a multi-barrel transport mechanism and/or process, die frame, pin plate, such as are further described below and/or in the incorporated patent applications, and may be transferred by other mechanisms and processes, or by combinations of the mechanisms/processes described herein. In embodiments, the subsequent surface can be an intermediate surface or an actual final substrate. For example, the intermediate surface can be a transfer surface, including a "blue tape," as would be known to persons skilled in the relevant art(s). When the subsequent surface is a substrate, the subsequent surface may be a substrate structure that includes a plurality of tag substrates, or may be another substrate type.

In step 706, if the subsequent surface is a substrate to which the dies are going to be permanently attached, the process of flowchart 700 is complete. The process can then proceed to step 310 of flowchart 300, if desired. If the subsequent surface is not a final surface, then the process proceeds to step 704, where the plurality of dies are then transferred to another subsequent surface. Step 704 may be repeated as many times as is required by the particular application.

Flowchart 800 of FIG. 8 is substantially similar to flowchart of 700. However, instead of including step 702, flowchart 800 includes step 802. In step 802, a wafer 400 that includes a plurality of dies is received. Thus, in flowchart 800, a wafer 400 is operated on directly, without being applied to a support surface or structure. Embodiments for both of flowcharts 700 and 800 are described herein.

Any of the intermediate/transfer surfaces and final substrate surfaces may or may not have cells formed therein for dies to reside therein. Various processes described below may be used to transfer multiple dies simultaneously between first and second surfaces, according to embodiments of the present invention. In any of the processes described herein, dies may be transferred in either pads-up or pads-down orientations from one surface to another.

The die transfer processes described herein include transfer using an adhesive surface, a parallel die punch process, die plates, including die receptacle structures, pin plates, die transfer heads, and die transfer head coverage patterns. Elements of the die transfer processes described herein may be combined in any way, as would be understood by persons skilled in the relevant art(s). These die transfer processes, and related example structures for performing these processes, are further described in the following subsections.

2.0 Die Transfer Into a Die Receptacle Structure

According to an embodiment of the present invention, dies can be transferred from a wafer or support structure into cells of a die receptacle structure. The die receptacle structure has a plurality of cells, typically arranged in an array of rows and columns of cells, where each cell can hold a die. After dies are transferred into the die receptacle structure, the dies can then be transferred to subsequent intermediate/transfer structures or surfaces, or to a final structure or surface, such as a substrate.

Figure 9A:
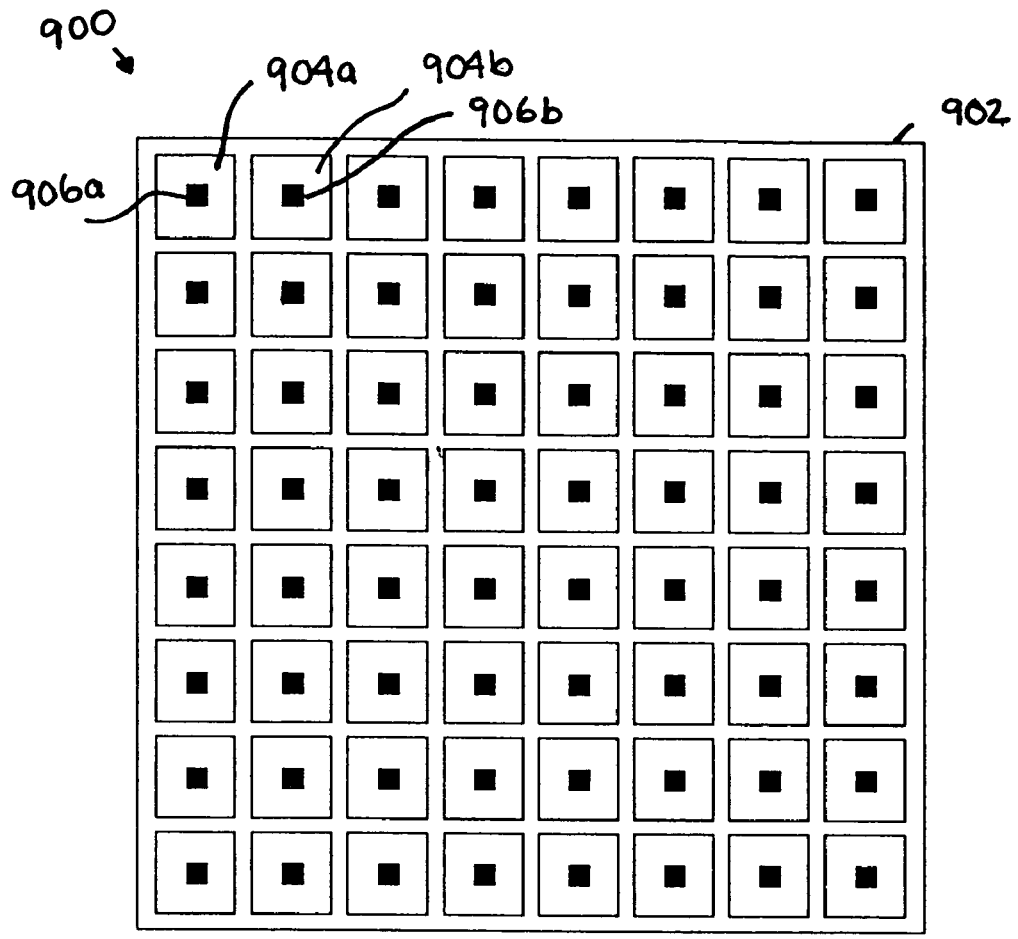
FIGS. 9A and 9B show plan and cross-sectional views, respectively, of an example die receptacle structure, according to an embodiment of the present invention.
Figure 9B:
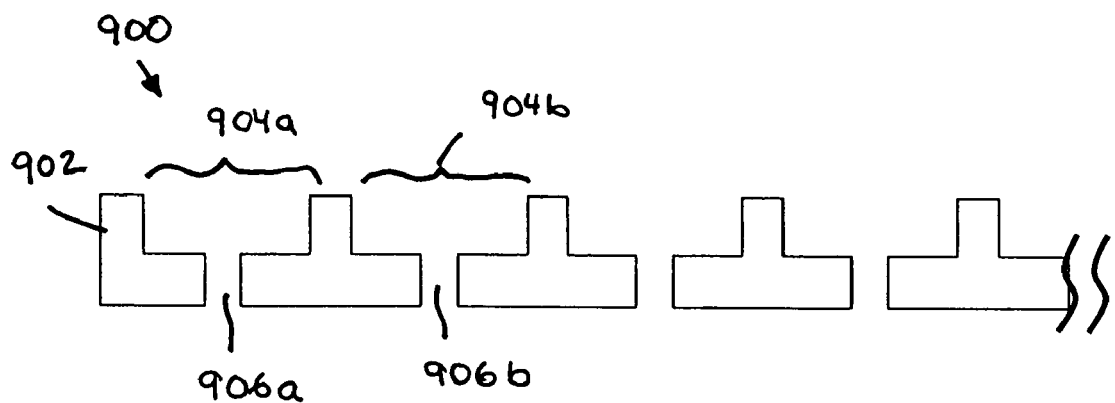

FIGS. 9A and 9B show plan and a cross-sectional views of an example die receptacle structure 900, according to an embodiment of the present invention. As shown in FIGS. 9A and 9B, die receptacle structure 900 comprises a body 902. A plurality of cells 904 are formed in a surface of body 902. Cells 904 can each hold or contain a die such as a die 104. As shown in FIG. 9A, cells 904 are substantially square or rectangular, but cells 904 can have alternative shapes.

Furthermore, as shown in FIGS. 9A and 9B, each cell 904 has a corresponding opening or hole 906. While cells 904 are formed in a first surface of body 902, holes 906 extend all the way through body 902, being open in a corresponding cell 904 at the first surface and at a second surface of body 902.

As shown in FIG. 9A, body 902 is substantially square or rectangular in shape, although body 902 can have other shapes. Furthermore, as shown in FIG. 9B, body 902 can be flat, having a substantially planar shape. Note, however, that body 902 can have any applicable thickness. In embodiments, body 902 can be made from numerous materials, including a metal or combination of metals/alloy, a plastic, a polymer, glass, a substrate material, other material, and/or any combination thereof. Furthermore, note that although holes 906 are shown in FIG. 9A as being substantially square or rectangular in shape, holes 906 can have other shapes, including round or elliptical. Furthermore, note that a size or area of a cell 904 is greater than a size or diameter of a hole 906. Note, however, that the relative sizes of cell 904 and hole 906 can vary from that shown in FIGS. 9A and 9B, where hole 906 has a size much closer to the size of cell 904. Furthermore, a size of hole 906 can be much smaller relative to a size of cell 904.

Die receptacle structure 900 is referred to by other names, including a waffle structure, a waffle grid, and a nest structure or nest plate. Furthermore, die receptacle structure is considered a type of "die plate" that has cells formed therein. Further die plate types, including those which do not have cells formed therein, are described in co-pending application, "Method, System, and Apparatus for Transfer of Dies Using a Die Plate," U.S. Ser. No. 10/866,253, which is herein incorporated by reference in its entirety.

Note that a die receptacle structure 900 can be formed to hold any number of dies. For example, a die receptacle structure 900 can be formed to hold a number of dies in the 10s, 100s, 1,000s, 10,000s, or greater numbers of dies.

Furthermore, note that cells 904 can be referred to by other names. For example, cells 904 can be referred to as cavities, cubbies, or by other similar names.

FIG. 10 shows a perspective view of a die receptacle structure 900, according to an example embodiment of the present invention.

FIG. 11 shows a plurality of dies 104 attached to a support structure 404 (the support structure 404 is shown to be transparent, for illustrative purposes) that is aligned over a die receptacle structure 900, for die transfer purposes. Each die 104 attached to support structure 404 is aligned over a corresponding cell 904 of die receptacle structure 900.

Figure 12:
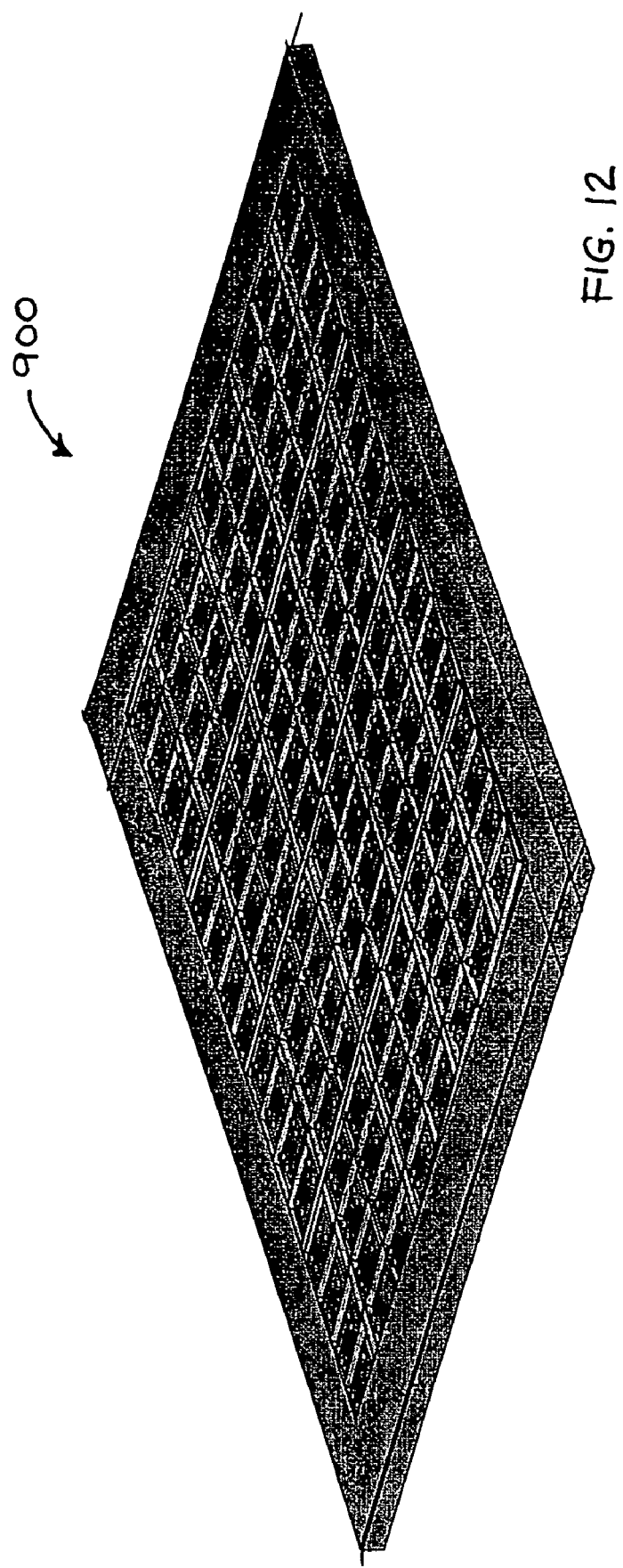
FIG. 12 shows a perspective view of a die receptacle structure, with each cell filled with a corresponding die, according to an example embodiment of the present invention.

FIG. 12 shows a die receptacle structure 1200 that has all cells 1204 filled with a corresponding die 104, according to an example embodiment of the present invention. For example, a die receptacle structure similar to die receptacle structure shown in FIG. 12 could have 135 rows and 270 columns of cells or any other number of rows and columns as required by the particular application. In an example embodiment, die receptacle structure 1200 has dimensions of 10.63 inches in the x and y directions and a thickness of 4100 μm. In addition, the outermost rows and columns of cells in the example embodiment of die receptacle structure 1200 are located 0.5 inches from the outer edges of the structure. These example values are only provided for illustrative purposes and are not limiting.

Figure 13C:
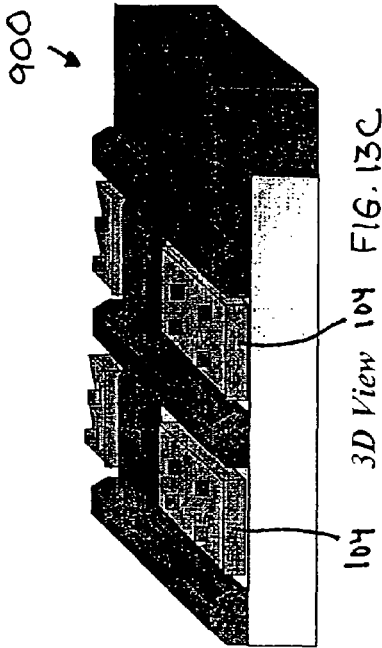
FIGS. 13A-13D show various views of a portion of a die receptacle structure, according to example embodiments of the present invention.
Figure 13D:
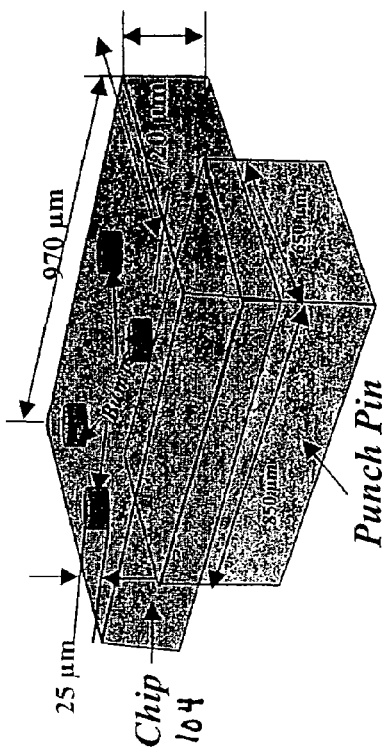
Figure 13A:
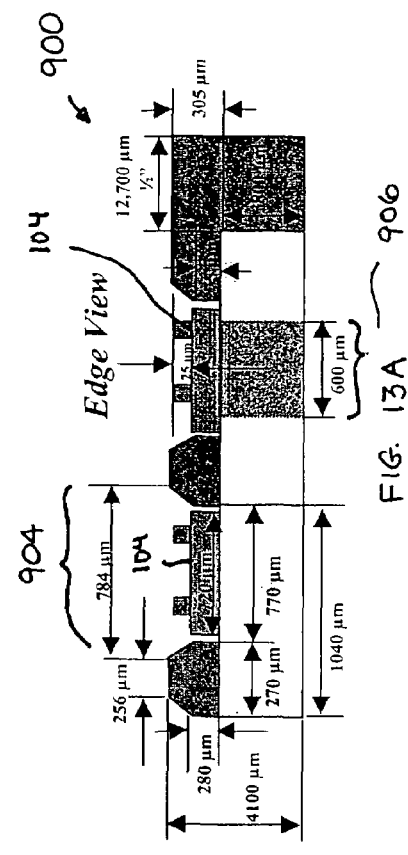
Figure 13B:
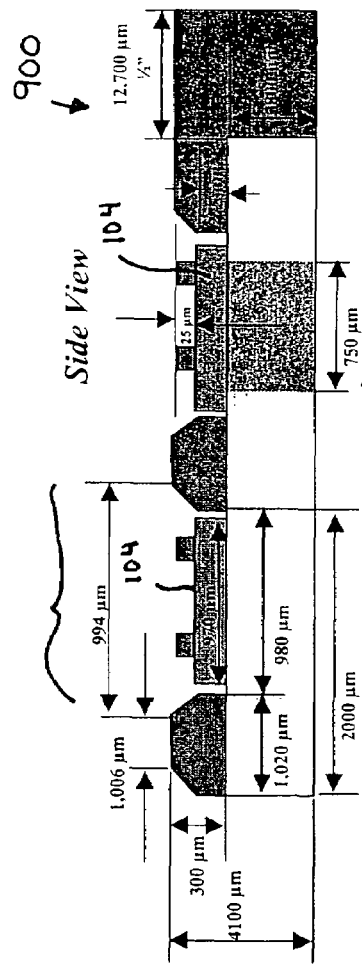

FIGS. 13A-13D show various views of a portion of a die receptacle structure 900, according to example embodiments of the present invention. FIG. 13A shows an first side cross-sectional view of a die receptacle structure 900 that is filled with dies 104, showing example dimension values for various dimensions of the example die receptacle structure 900. FIG. 13B shows a second side cross-sectional view (i.e. die receptacle structure 900 is rotated by 90 degrees) of the die receptacle structure 900, that is filled with dies 104, also showing example dimensional values. FIG. 13C shows a perspective view of the die receptacle structure 900. FIG. 13D shows a die 104 as it would reside in a cell 904 (not shown), with a punch-pin that can be used to move the die 104 out of cell 904, according to embodiments of the present invention.

Figure 14A:
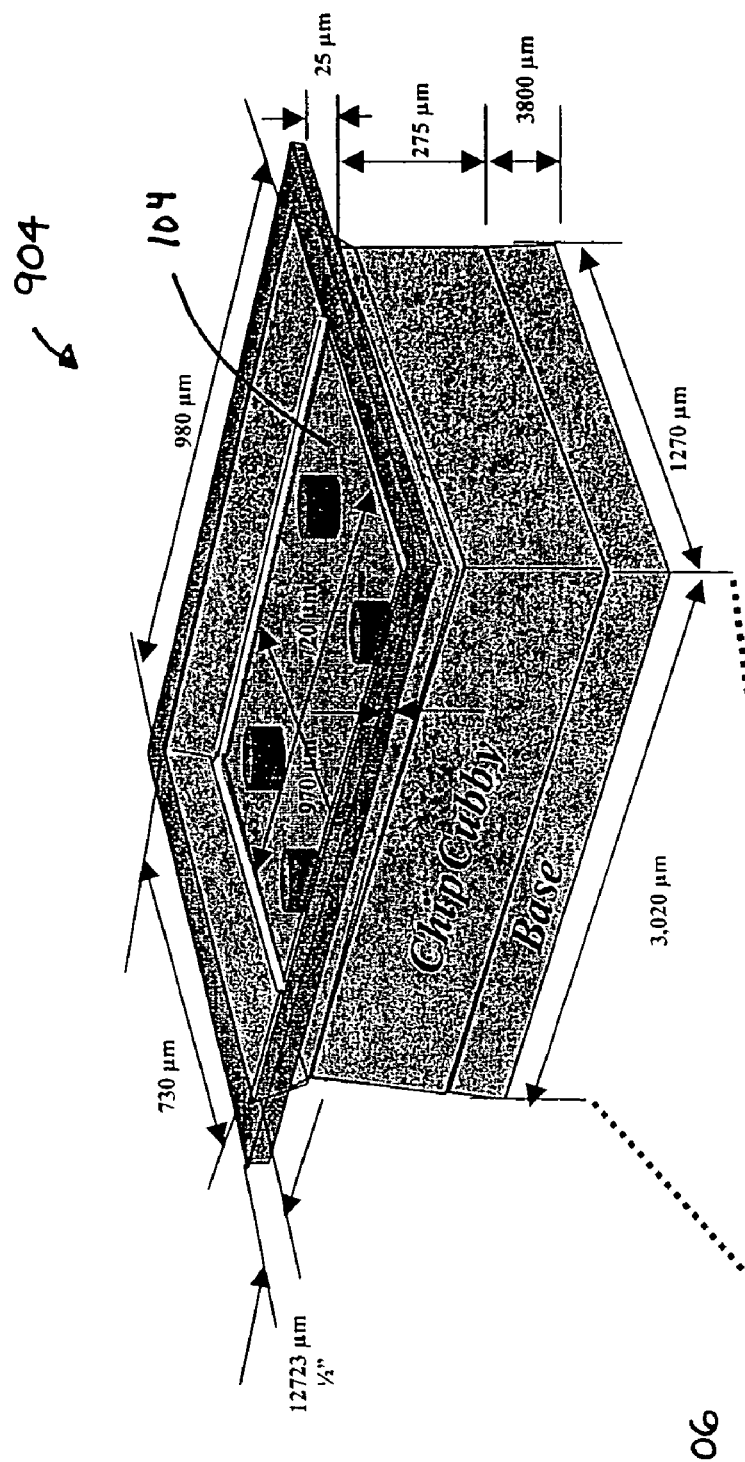
FIGS. 14A and 14B show perspective and bottom views, respectively, of a single cell of a die receptacle structure, according to embodiments of the present invention.
Figure 14B:
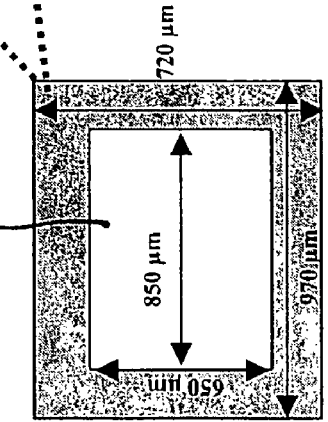

FIGS. 14A and 14B show perspective and bottom views, respectively, of a single cell 904, according to embodiments of the present invention. FIG. 14A shows example dimensional values for various dimensions of the example cell 904. The bottom view of FIG. 14B shows dimensions of the bottom of the cell 904, including example dimensions for hole 906 that corresponds to cell 904.

Thus, in embodiments, die receptacle structure 900 is an example of transfer structure 610 shown in FIG. 6. Die receptacle structure 900 can be used to transfer dies from a wafer to a substrate, or to another intermediate transfer structure.

Figure 15:
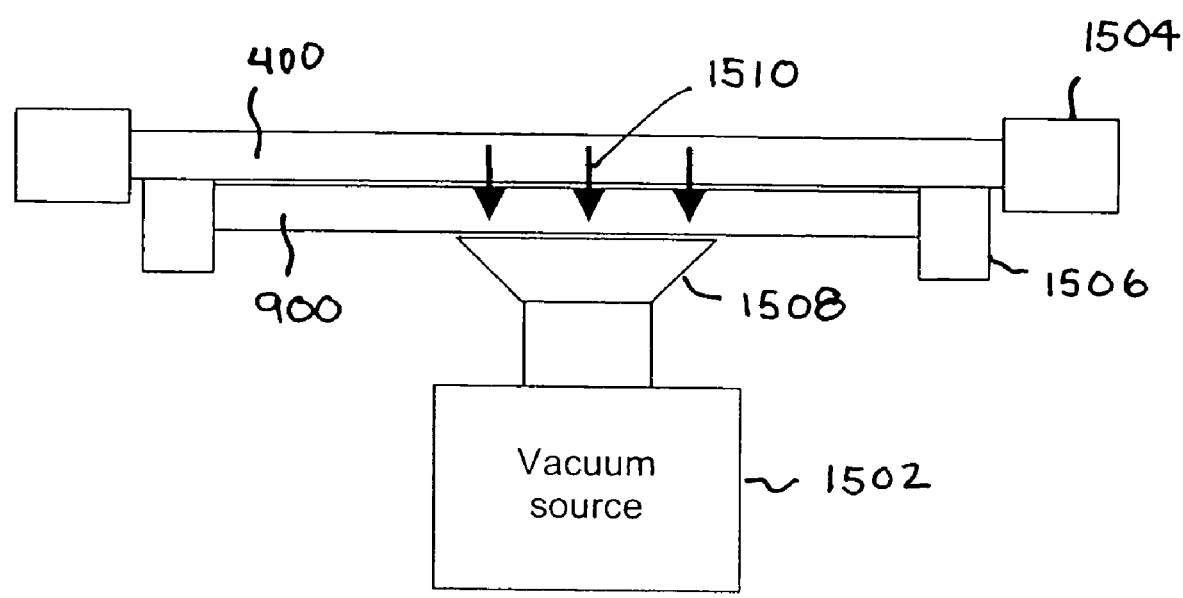
FIG. 15 shows an example vacuum assisted die transfer system, according to an example embodiment of the present invention.

FIG. 15 shows an example die transfer system 1500 that can be used to transfer dies from a wafer 400 to a die receptacle structure 900, according to an example embodiment of the present invention. For example, system 1500 can be used to transfer dies along path 604A, shown in FIG. 6. System 1500 includes a wafer 400, die receptacle structure 900, and a vacuum source 1502. In the example of FIG. 15, wafer 400 is held in position by a jig or chuck 1504, and die receptacle structure 900 is held in position by a jig or chuck 1506. A vacuum source chuck 1508 interfaces vacuum source 1502 with a second surface of die receptacle structure 900. Wafer 400 is aligned with the first surface of die receptacle structure 900.

During operation of the present invention, dies 104 of wafer 400 pass from wafer 400 to die receptacle structure 900 due to a suction of vacuum source 1902. For example, as shown in FIG. 15, vacuum source 1502 creates a suction that is directed as shown by arrows 1510, that moves dies that are separated from wafer 400 into cells 904 of die receptacle structure 900. System 1500 may be varied in many ways to transfer dies from wafer 400, or from a support structure, into die receptacle structure, according to embodiments of the present invention. These embodiments are described in further detail in the following paragraphs.

Figure 16:
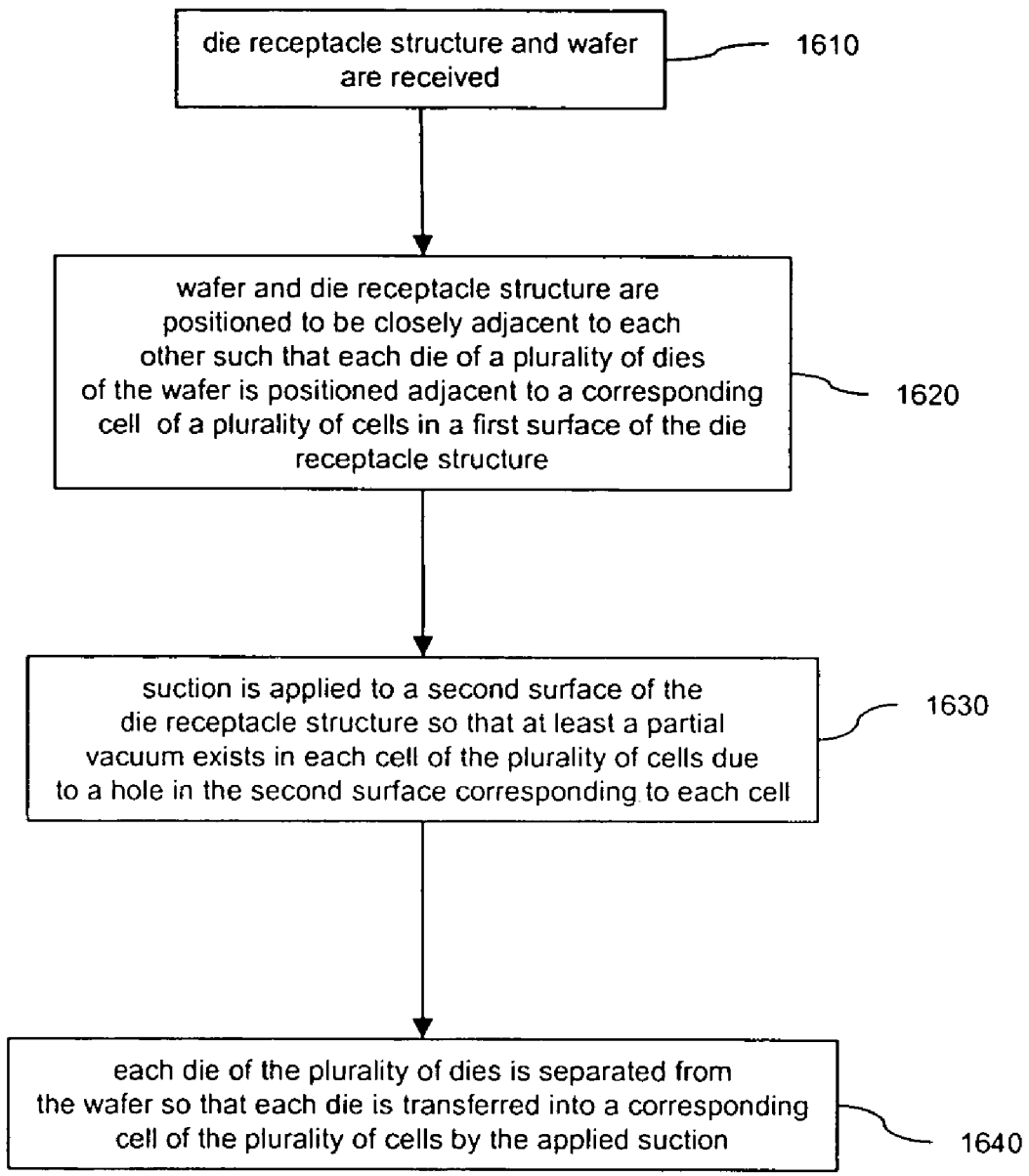
FIG. 16 shows a flowchart providing example steps for vacuum assisted transfer of dies from a wafer into a die receptacle structure, according to embodiments of the present invention.

FIG. 16 shows a flowchart 1600 of a method for transferring die into a die receptacle structure, according to embodiments of the present invention. The flowchart depicted in FIG. 16 is described with continued reference to FIGS. 9 and 17-23. However, flowchart 1600 is not limited to those embodiments. Further operational and structural embodiments of the present invention will be apparent to persons skilled in the relevant arts based on the following discussion. Note that in alternative embodiments, the steps shown in FIG. 16 can occur in an order other than that shown.

Figure 17:
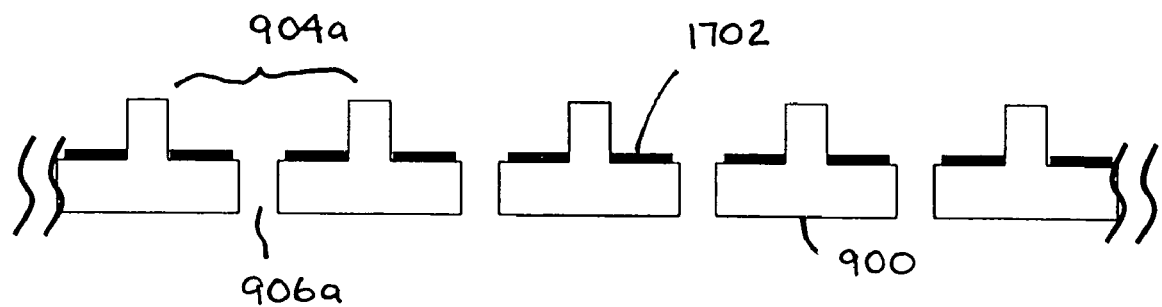
FIGS. 17-23 show example implementations of the steps of the flowchart of FIG. 16, according to embodiments of the present invention.
Figure 18:
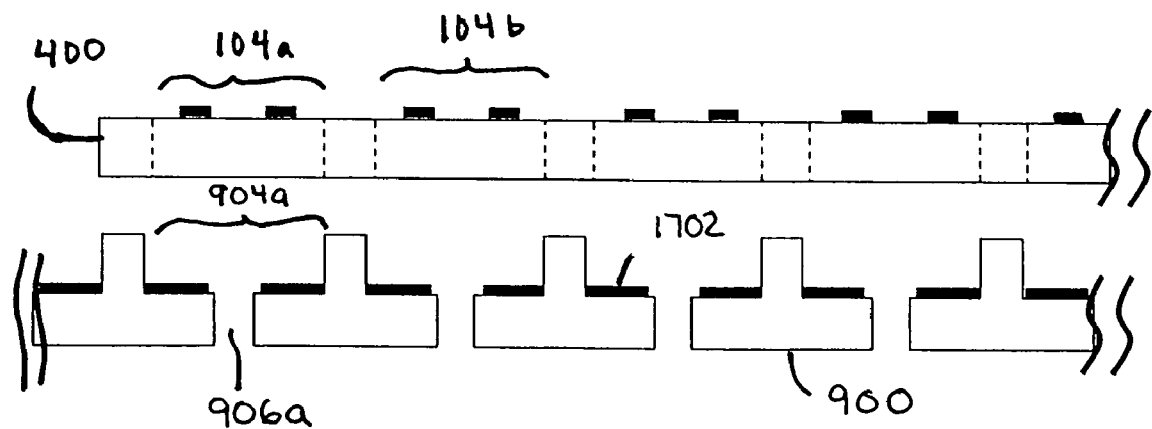

Flowchart 1600 begins in step 1610 when a die receptacle structure and a wafer are received. FIG. 17 shows an example die receptacle structure 900, according to an embodiment of the present invention. As shown in FIG. 17, an adhesive material has been applied to the first surface of die receptacle structure 900. Thus, each of cells 904 in die receptacle structure have an adhesive material layer 1702 formed therein. Adhesive material layer 1702 may be any type of adhesive material, including an epoxy, an adhesive tape, or any other adhesive material.

Figure 22:
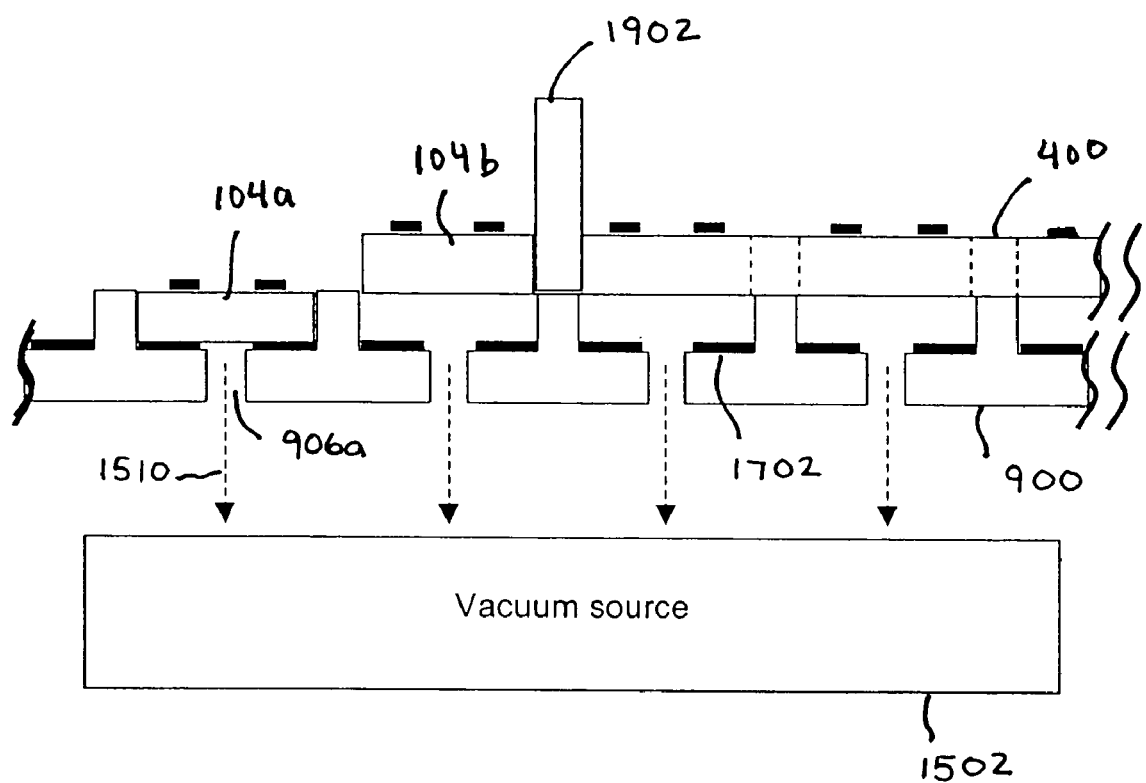

In step 1620, the wafer 400 and die receptacle structure are positioned to be closely adjacent to each other such that each die of a plurality of dies of the wafer is positioned adjacent to a corresponding cell of a plurality of cells in a first surface of the die receptacle structure. For example, FIG. 22 shows a wafer 400 positioned relative to die receptacle structure 900 so that each die 104 of wafer 400 is positioned adjacent to a corresponding cell 904 of the plurality of cells 904 in the first surface of die receptacle structure 900.

In step 1630, a suction is applied at a second surface of the die receptacle structure so that at least a partial vacuum exists in each cell of the plurality of cells due to a hole in the second surface corresponding to each cell.

Figure 19:
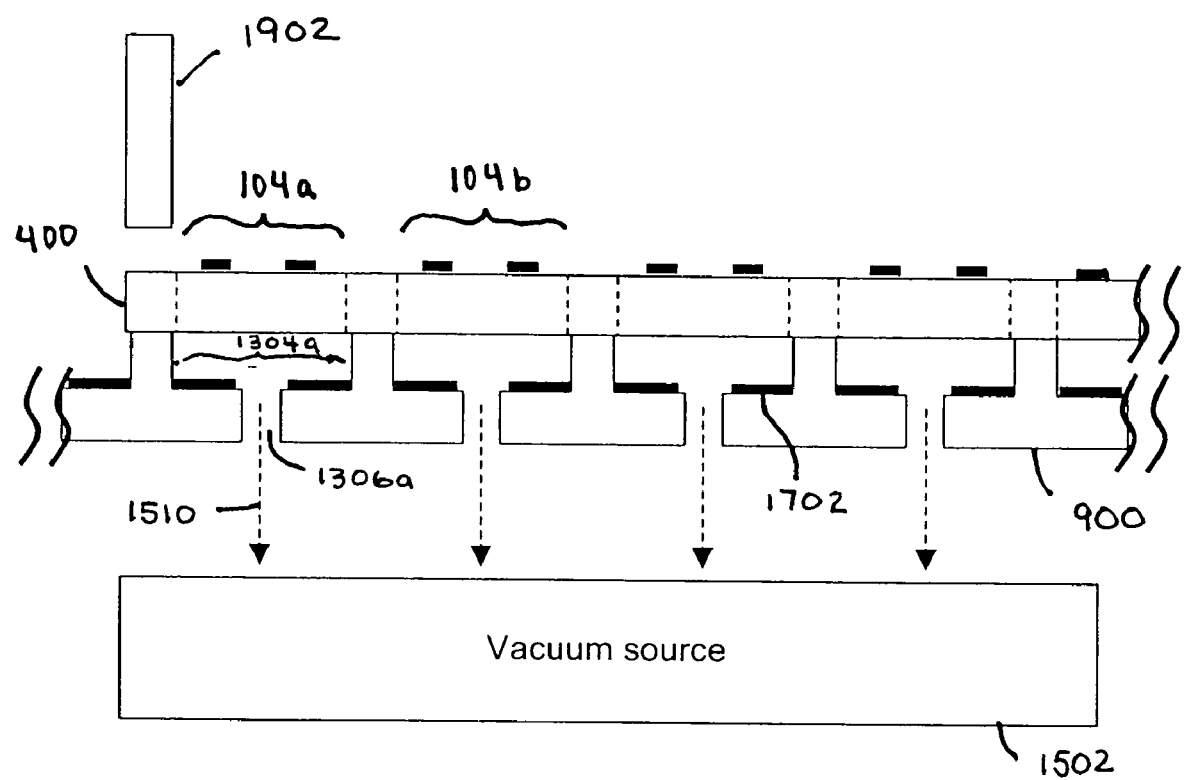

For example, FIG. 19 shows wafer 400 positioned even more closely adjacent to die receptacle structure 900. Furthermore, a vacuum or suction is shown applied in the direction of arrows 1510 by vacuum source 1502. Furthermore, a saw mechanism 1902 is shown in ready position to be applied to wafer 400. Saw mechanism 1902 may be any kind of sawing or cutting member, including a saw or other type of blade, a laser, or other cutting or sawing device.

In step 1640, each die of the plurality of dies is separated from the wafer so that each die is transferred into the corresponding cell of the plurality of cells by the applied suction.

Figure 20:
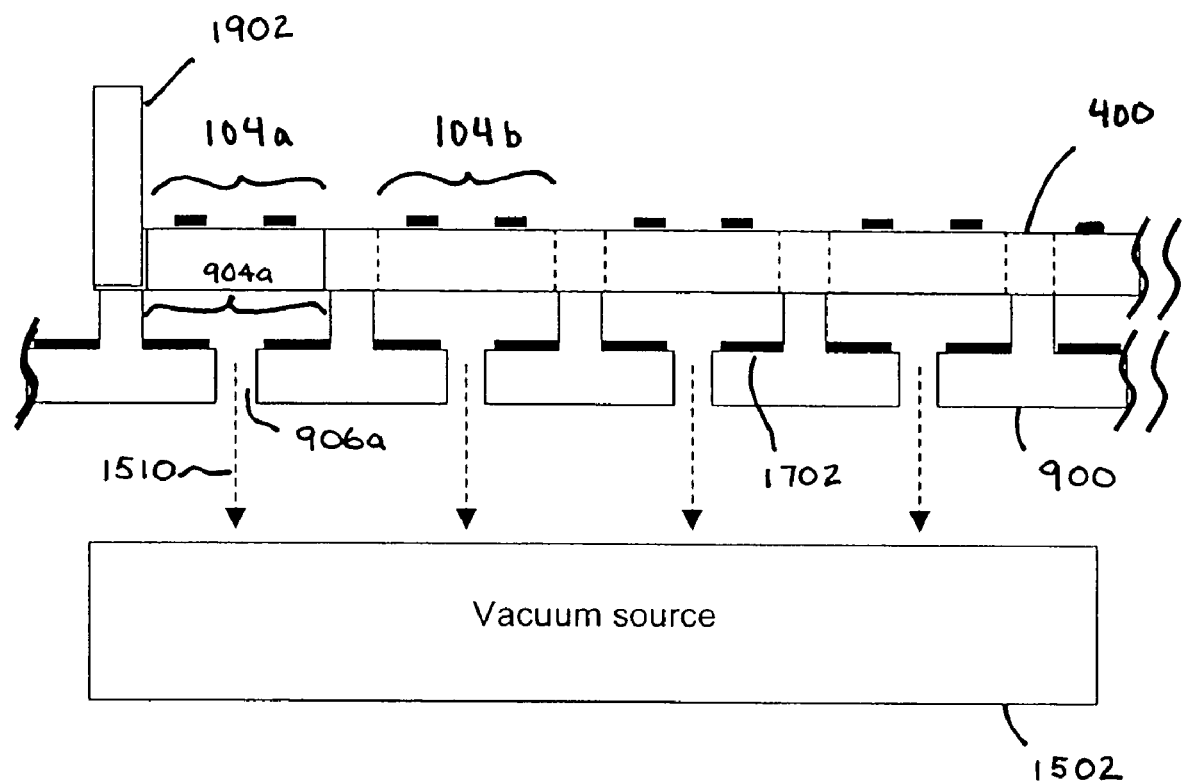

In an embodiment, the separation step is performed by a saw mechanism. For example, FIG. 20 shows saw mechanism 1902 being applied to wafer 400 to cut or saw one edge of a die 104A free from wafer 400.

Figure 21:
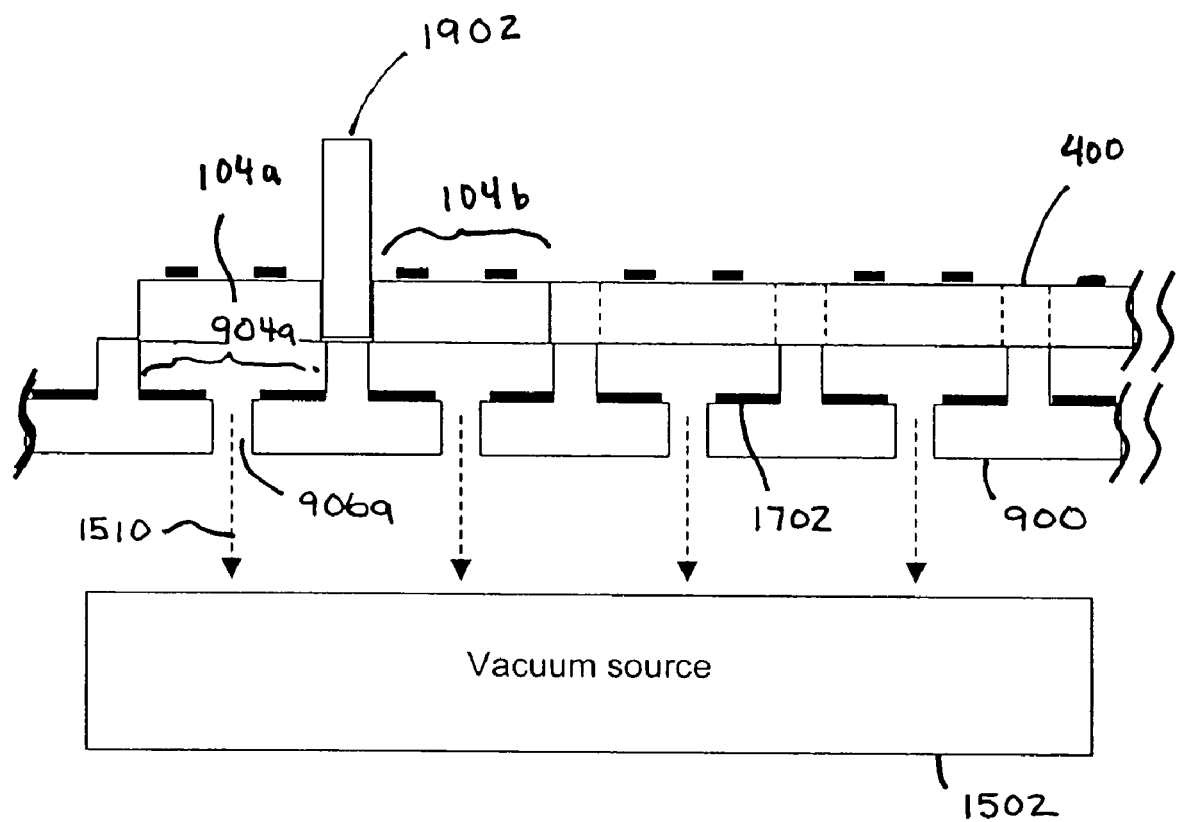

In a further example, FIG. 21 shows saw mechanism 1902 being used to saw a second edge of die 104A free from wafer 400.

As mentioned above, vacuum source 1502 applies a vacuum or suction in the direction of 1510, shown in FIG. 21. According to step 1630 of flowchart 1600 shown in FIG. 16, vacuum source 1502 creates at least a partial vacuum in each of cells 904 by directing a vacuum or suction along the direction of arrow 1510 through holes 906 in die receptacle structure 900. Thus, as shown in FIG. 22, dies are separated from the wafer according to FIG. 7, saw mechanism 1902, and are transferred into the corresponding cell 904 due to the suction force of vacuum source 1502. Thus, FIG. 22 shows an example implementation of step 1640 of flowchart 1600. For example, as shown in FIG. 22, as die 104A has been freed from wafer 400 by saw mechanism 1902, die 104a has been transferred or drawn into cell 904A by vacuum source 1502 through hole 906A. Furthermore, die 104A has become attached in cell 904A due to adhesive material layer 1702. The process of freeing dies 104 from wafer 400 can be continued until as many dies as desired have been separated from wafer 400, and have been transferred into cells 904 of die receptacle structure 900, including some or all dies 104 of wafer 400.

Figure 23:
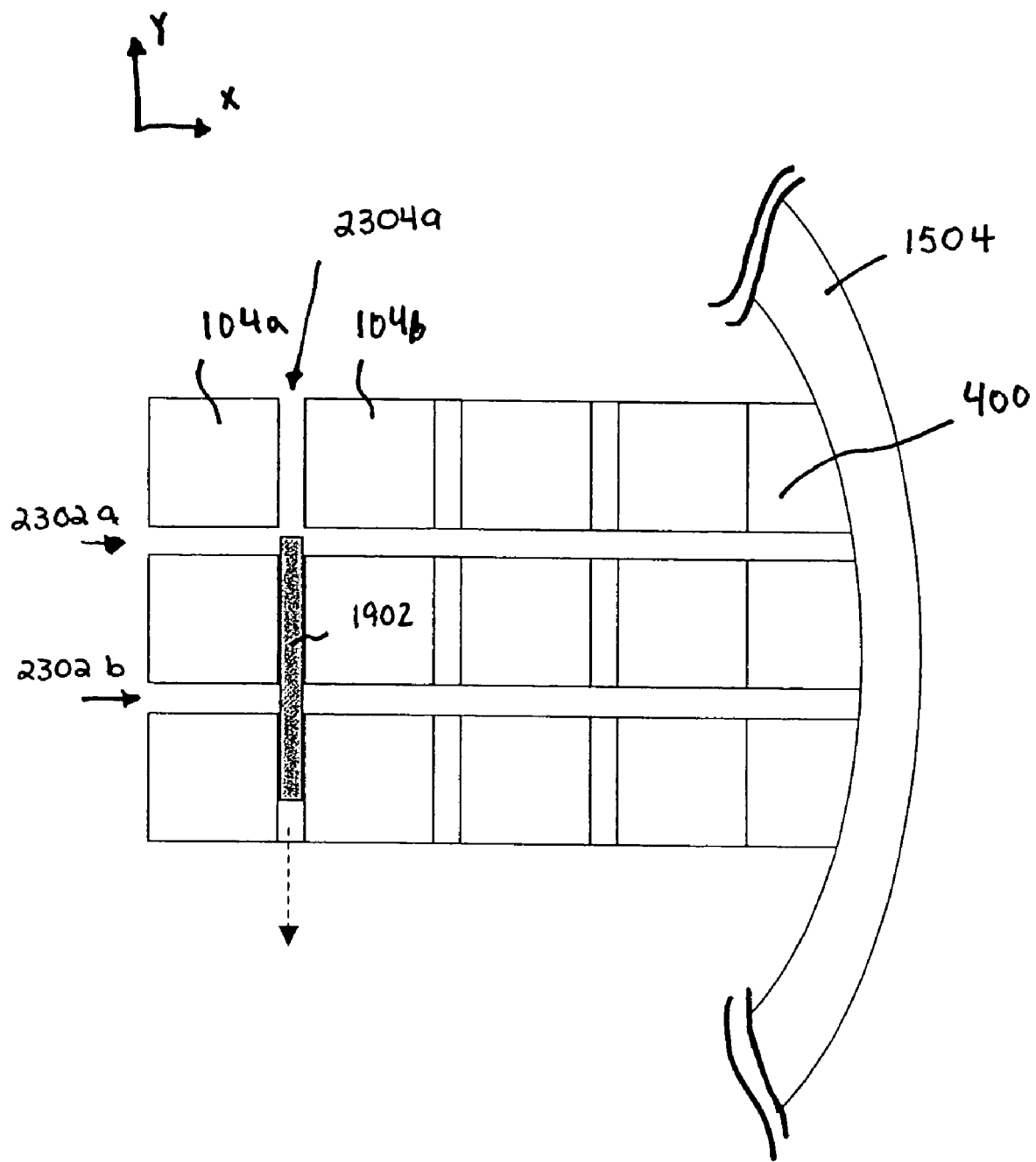

FIG. 23 shows a plan view of an example wafer portion of wafer 400 that is held by a jig or chuck 1504. As shown in FIG. 23, wafer 400 has been sawed or cut by sawing mechanism 1902 along an X axis, as shown by X axis cuts 2302A and 2302B. Furthermore, an Y axis cut 2304 is shown being made in wafer 400. Cut 2304 has freed die 104A from wafer 400. Thus, as shown in FIG. 22, die 104A is free to transfer into a corresponding cell 904, assisted by vacuum source 1502. Cuts through wafer 400 can continue to separate the remaining dies 104 of wafer 400, and to transfer the dies 104 into corresponding cells 904 of die receptacle structure 900.

Note that dies 104 can be separated from wafer 400 in a number of ways, including by the parallel use of multiple sawing mechanisms 1902.

Figure 32:
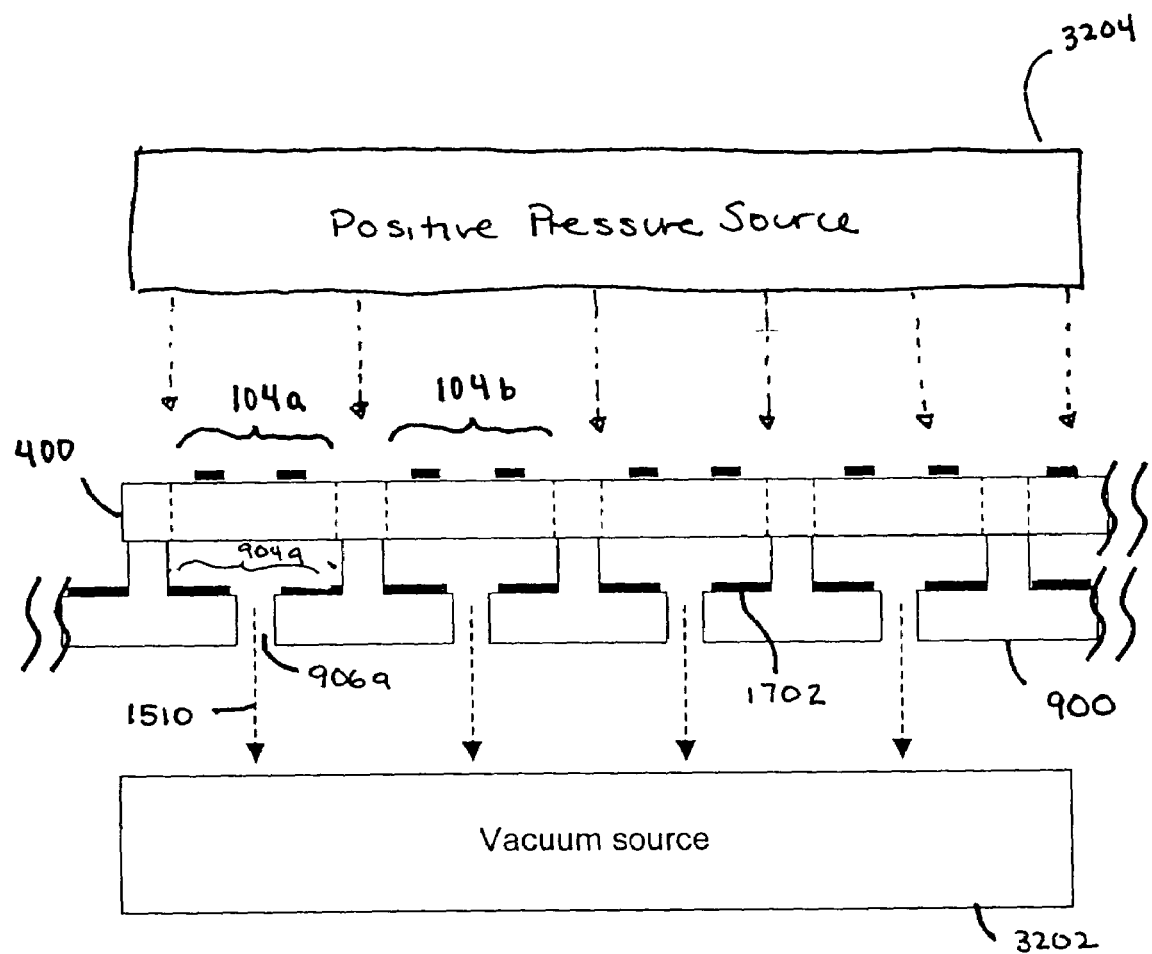
FIG. 32 shows an exemplary system having a positive pressure source and a vacuum/suction source, according to an example embodiment of the present invention.

In an embodiment, positive pressure is applied to the top surface of the wafer in addition to the suction/vacuum (or negative pressure) applied to the second surface of the die receptacle structure to aid the transfer of dies into the die receptacle structure. FIG. 32 shows an exemplary system having a positive pressure source and a vacuum/suction source, according to an example embodiment of the present invention. As shown in FIG. 32, positive pressure source 3204 exerts a positive pressure on the top surface of wafer 400. The positive pressure source 3204 could be a mechanical member that is lowered to contact the top surface of wafer 400 and to apply pressure thereto. Alternatively, positive pressure source 3204 could provide a punching force through the use of a continuous or burst of air or similar type of pressure.

While the positive pressure source is applying a positive pressure to the top surface of the wafer, the suction/vacuum source applies a negative pressure, described above. Alternatively, the positive pressure and vacuum may be applied in an alternating manner. The combination of positive pressure and negative pressure causes dies to transfer from wafer 400 to die receptacle structure 900.

In some embodiments, dies 104 can be transferred from a support surface into die receptacle structure 900. FIG. 24 shows a flowchart 2400 of a method for transferring a die from a support structure into a die receptacle structure, according to embodiments of the present invention. The flowchart depicted in FIG. 24 is described with continued reference to FIGS. 9 and 25-27. However, flowchart 2400 is not limited to those embodiments. Further operational and structural embodiments of the present invention will be apparent to persons skilled in the relevant arts based on the following discussion. Note that in alternative embodiments, the steps shown in FIG. 24 can occur in an order other than that shown.

Figure 25:
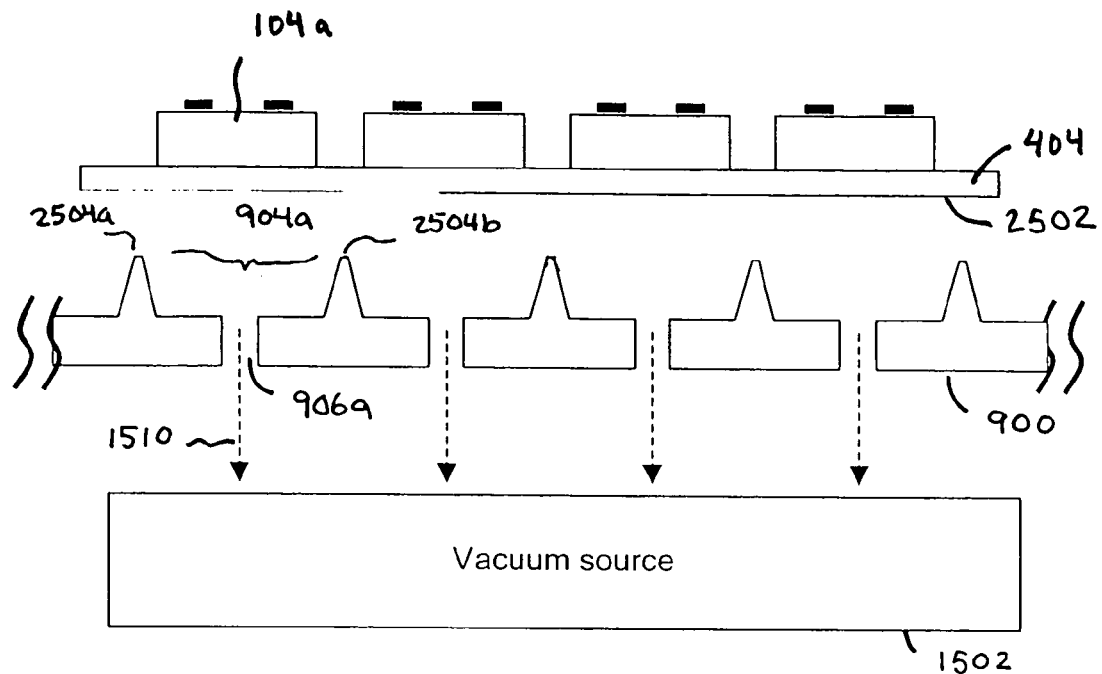
FIGS. 25-27 show example implementations of the steps of the flowchart of FIG. 24, according to embodiments of the present invention.

Flowchart 2400 begins in step 2402 when the support structure and die receptacle structure are positioned to be closely adjacent to each other such that each die of a plurality of dies attached to the support structure is positioned adjacent to a corresponding cell of a plurality of cells in a first surface of the die receptacle structure. For example, FIG. 25 shows an example of step 2402, where a support structure 404 that attaches dies 104 to a surface thereof is being positioned relative to the first surface of die receptacle structure 900. Each die attached to support structure 404 is positioned adjacent to a corresponding cell 904 of die receptacle structure 900.

As shown in FIG. 25, dies 104 are attached to support structure 404 and are oriented relative to die receptacle structure 900, where dies 104 face away from the cells 904 of die receptacle structure 900. In alternative embodiments, dies 104 may be positioned on the bottom surface of support structure 404.

In step 2404, a suction is applied at a second surface of the die receptacle structure so that at least a partial vacuum exists in each cell of the plurality of cells due to a hole in the second surface corresponding to each cell.

Figure 26:
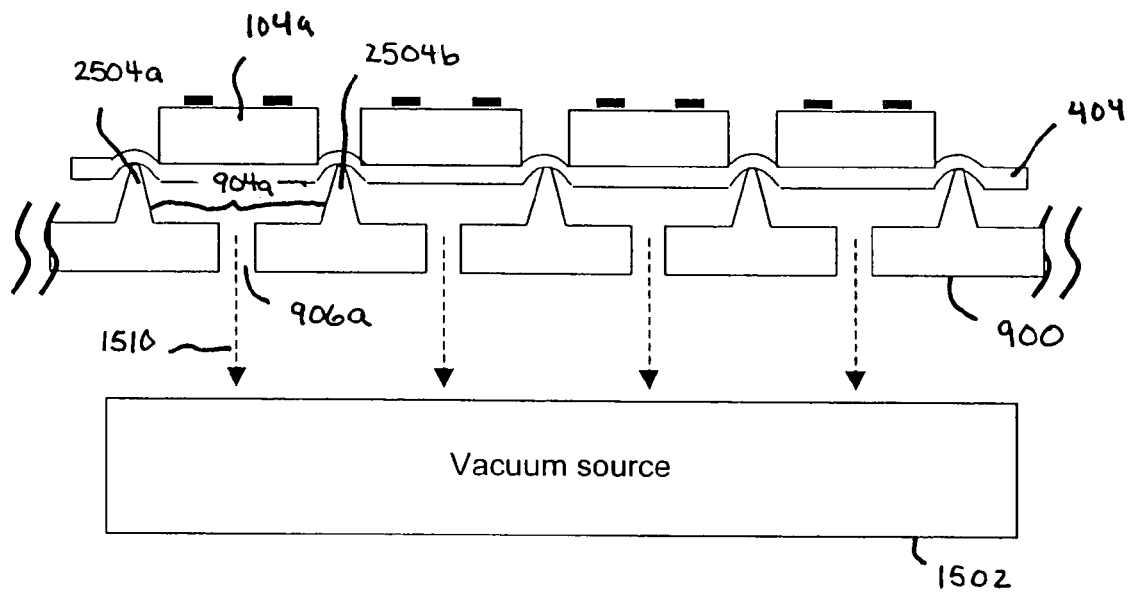
Figure 30:
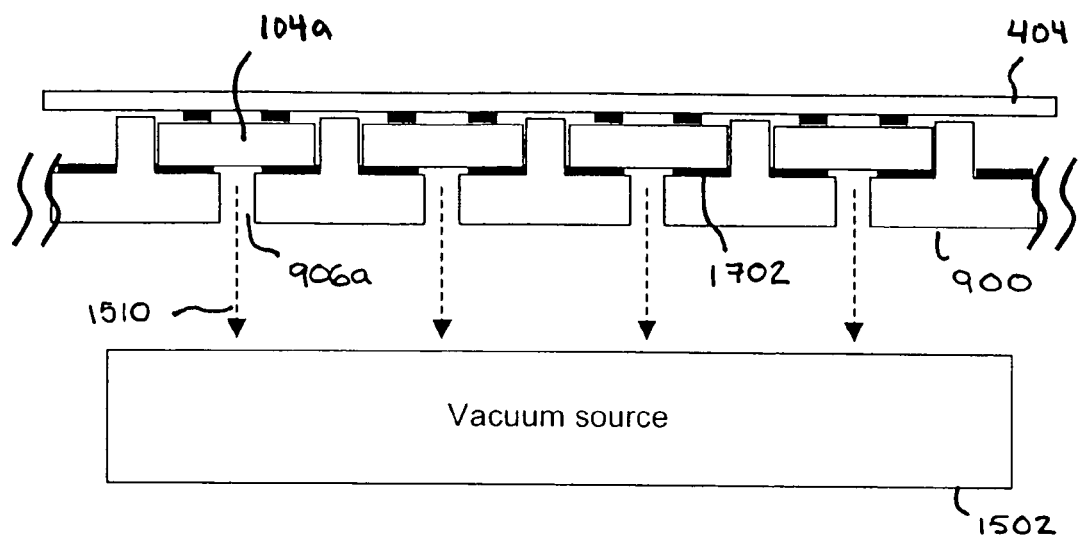

For example, as shown in FIG. 25 and FIG. 26, vacuum source 1502 applies suction, according to step 2404 of flowchart 2400 shown in FIG. 24. As shown in FIG. 26, support structure 404 has come in contact with the top surface of die receptacle structure 900. As shown in FIGS. 25 and 30, die receptacle structure 900 has been modified. In the embodiment of FIGS. 25 and 30, the first surface of die receptacle structure 900 has sharp edges. As shown in FIG. 25, the edges or portions of die receptacle structure 900 between cells 904 are sharp. For example, first and second sharp edges 2504A and 2504 are indicated for a first cell 904A. As will be shown below, sharp edges 2504 are used to separate dies 104 from support structure 2502.

Furthermore, as shown in FIG. 25 for support structure 404, support structure 404 has an adhesive surface 2502. Surface 2502 of support structure 404 is coated with an adhesive material that can be used to adhere dies 104 in cells 904 of die receptacle structure 900. Note that in an alternative embodiment, cells 904 can have an adhesive material formed therein, similarly to as that described above for FIGS. 17-23.

As shown in FIG. 26, vacuum source 1502 applies a suction in the direction of arrows 1510 at a second surface of die receptacle structure 900. As a result, at least a partial vacuum exists in each of cells 904 due to the hole 906 that corresponds to each of cells 904. This suction pulls or forces support structure 404 upon sharp edges 2504 of die receptacle structure 900.

In step 2406, the applied suction is allowed to cause the sharp portions of the die receptacle structure to cut the support structure around each die of the plurality of dies, such that each die of the plurality of dies is separated from the support structure and is transferred into the corresponding cell of the plurality of cells by the applied suction.

Figure 27:
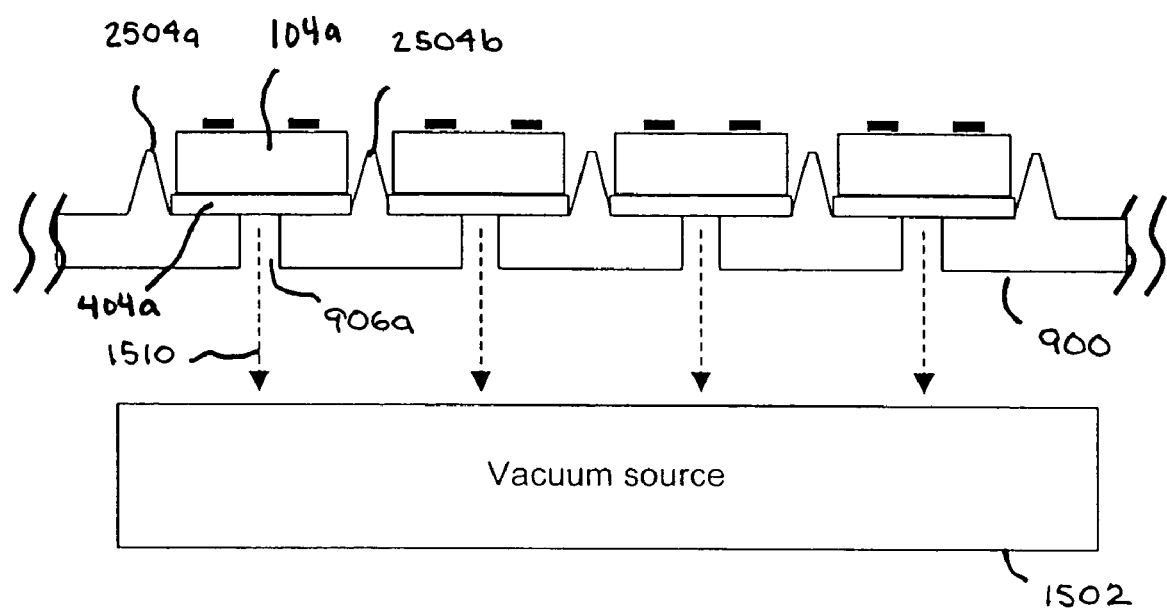

FIG. 27 shows an example implementation of step 2406 of flowchart 2400, shown in FIG. 24. As shown in FIG. 27, the suction applied by vacuum source 1502 is allowed to cause the sharp edges or portions 2504 of die receptacle structure 900 around each die 104 of support structure 404 to cut support structure 404 around each die 104. Thus, each die 104 is separated from support structure 404, and is free to remain into the corresponding cell 904. Thus, as shown in the embodiment of FIG. 27, the adhesive bottom surface of support structure 404 adheres each die in the respective cell 904. For example, as shown in FIG. 27, a portion 404A of support structure 404 adheres die 104A in cell 904A due to the adhesive material on surface 2502 of portion 404A.

FIG. 28 shows a flowchart 2800 of a method for transferring a die from a support structure to a die receptacle structure 900, according to embodiments of the present invention. The flowchart depicted in FIG. 24 is described with continued reference to FIGS. 9 and 19-31. However, flowchart 2800 is not limited to those embodiments. Further operational and structural embodiments of the present invention will be apparent to persons skilled in the relevant arts based on the following discussion.

Figure 29:
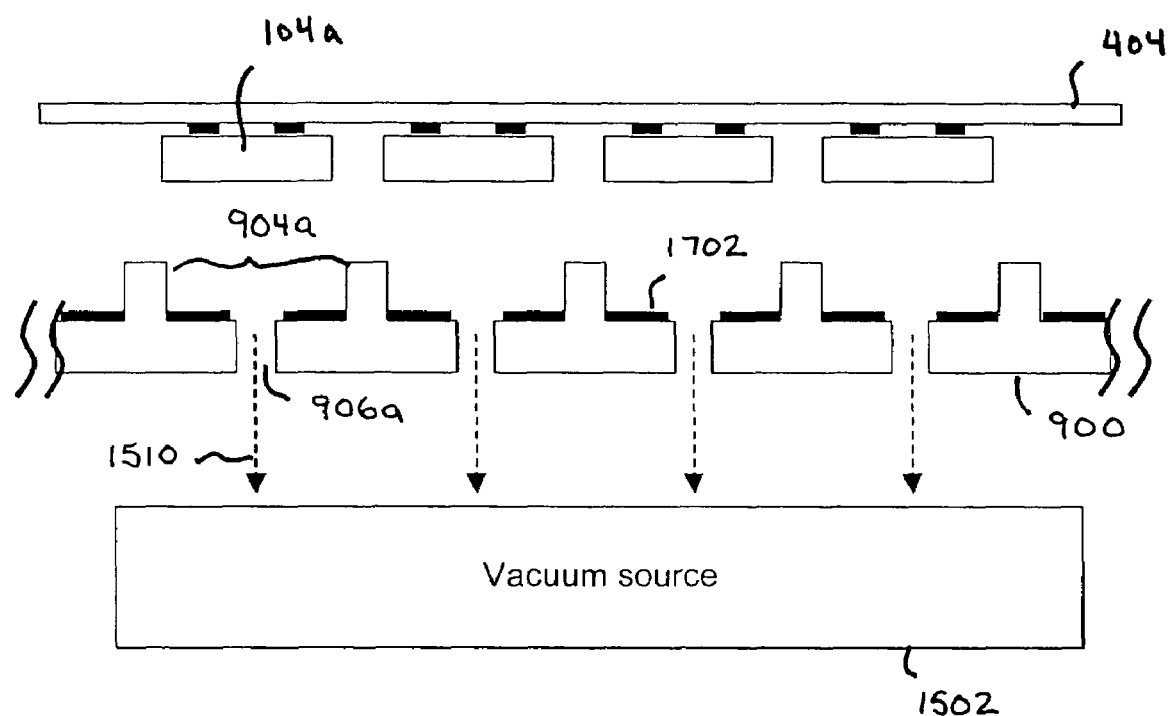
FIGS. 29-31 show example implementations of the steps of the flowchart of FIG. 28, according to embodiments of the present invention.

FIG. 29 shows an example support structure 404 having a plurality of dies 104 attached thereto. Dies 104 are shown in FIG. 29 attached to the bottom surface of support structure 404 in a die-down or pads-down fashion. In other words, the contact pads of die 104 are on the side of die 104 that is attached to support structure 404. In alternative embodiments, dies 104 may be attached to support structure 404 in a pads-up orientation.

Flowchart 2800 begins in step 2802 when the support structure and the die receptacle structure are positioned to be closely adjacent to each other such that each die of a plurality of dies attached to the support structure is positioned in a corresponding cell of a plurality of cells in a first surface of the die receptacle structure.

For example, FIG. 30 shows the bottom surface of support structure 404 positioned to be closely adjacent to die receptacle structure 900 such that each die 104 attached to the bottom surface of support structure 404 is positioned in a corresponding cell 904 of die receptacle structure 900. As shown in FIG. 30, each die 104 attaches to adhesive material layer 1702 that is present in each of cells 904.

In step 2804, each die of the plurality of dies is released from the support structure so that each die resides in the corresponding cell of the plurality of cells.

Figure 31:
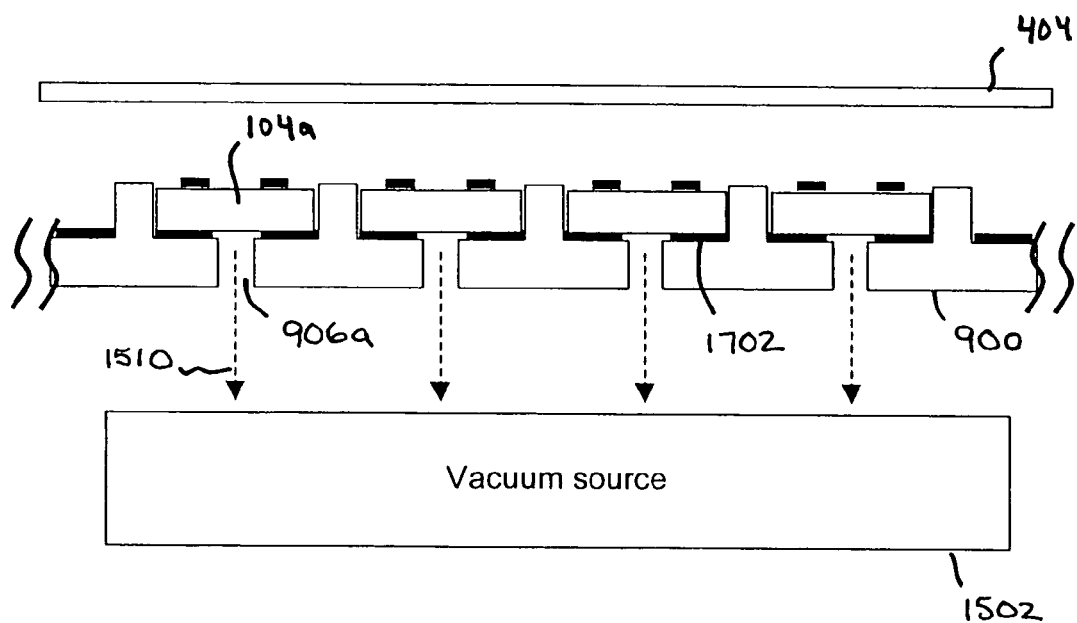

For example, FIG. 31 shows each die 104 of the plurality of dies 104 that were attached to support structure 404 released from support structure 404. Thus, each die 104 resides in the corresponding cell 904 of the plurality of cells 904 of die receptacle structure 900.

Dies 104 can be released from support structure 404 in a variety of ways, according to the present invention. For example, adhesive material layer 1702 may comprise a stronger adhesive force than the adhesive force of support structure 404. Thus, once dies 104 become attached to die receptacle structure 900 due to adhesive material layer 1702, support structure 404 can be withdrawn of peeled from die receptacle structure 900, leaving dies 104 attached in their corresponding cells 904. Thus, support structure 404 can merely be moved away from die receptacle structure 900 to cause dies 104 to be released. Furthermore, as shown in FIGS. 29-31, the vacuum or suction of vacuum source 1502 can be used to aid in holding dies 104 in cells 904 of die receptacle structure 900 when support structure 404 is moved away. Thus, vacuum source 1502 is optional in the embodiment related to FIGS. 28-31. Note that an adhesive material may be additionally applied to the bottom surfaces of dies 104 before positioning dies 104 in cells 904, instead of, or in addition to, the use of adhesive material layer 1702 in cells 904.

3.0 Recovery of Untransferred Dies From a Wafer

Figure 33:
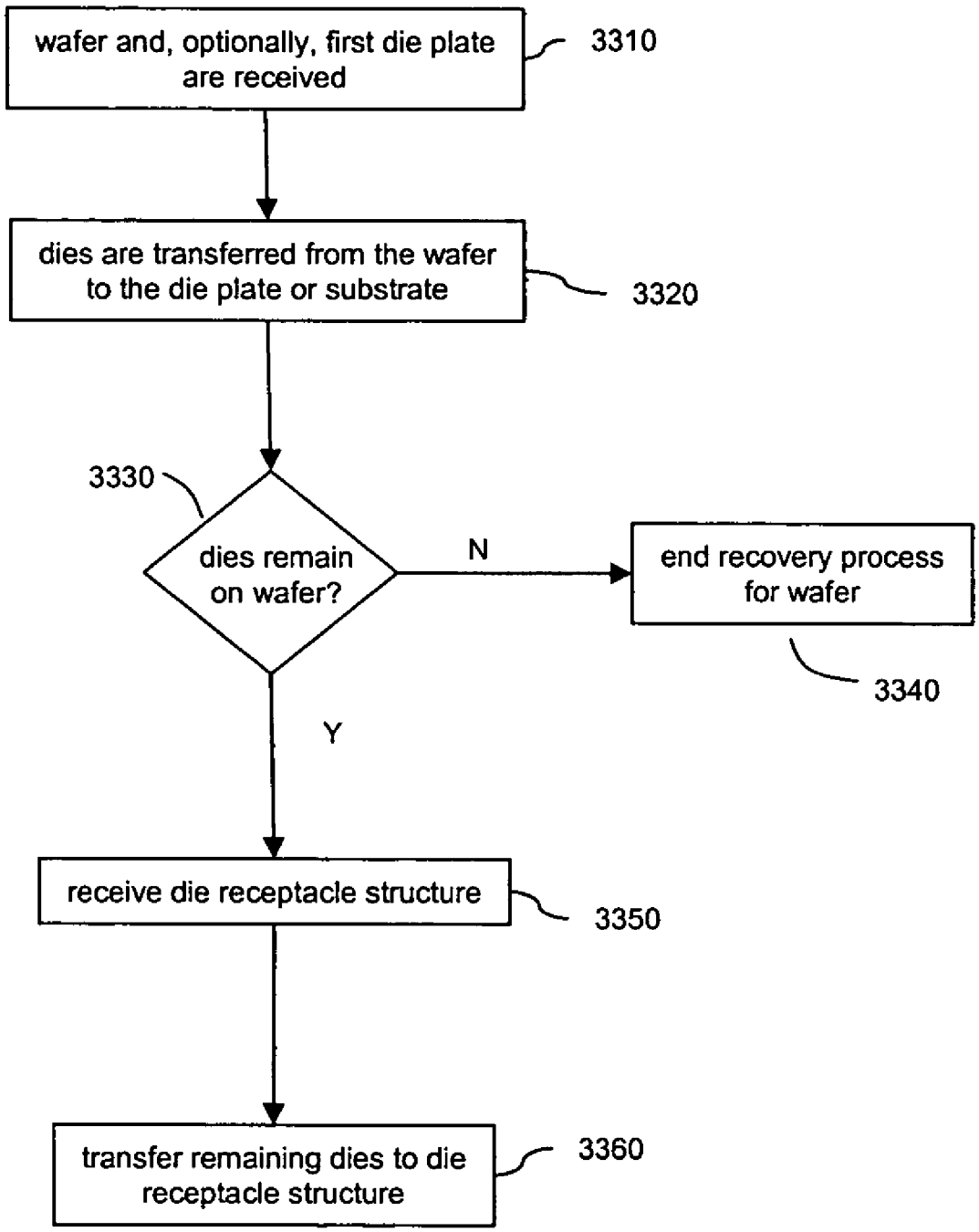
FIG. 33 shows a flowchart of a method for recovering untransferred dies using a die receptacle structure, according to embodiments of the present invention.

The die receptacle structure described herein can be used to recover dies from a wafer that are not otherwise transferred to a subsequent surface. For example, FIG. 33 shows a flowchart 3300 of a method for recovering untransferred dies using a die receptacle structure, according to embodiments of the present invention. The flowchart depicted in FIG. 33 is described with continued reference to FIGS. 9 and 34. However, flowchart 3300 is not limited to those embodiments. Further operational and structural embodiments of the present invention will be apparent to persons skilled in the relevant arts based on the following discussion. Note that in alternative embodiments, the steps shown in FIG. 33 can occur in an order other than that shown.

Flowchart 3300 begins at step 3310 when a wafer and, optionally, a first die plate are received. The first die plate can be a die receptacle structure, as described above, or a die plate as described in co-pending application, "Method, System, and Apparatus for Transfer of Dies Using a Die Plate," U.S. Ser. No. 10/866,253.

In step 3320, dies are transferred from the wafer to the die plate (or a substrate). For example, the dies can be transferred as described herein and in co-pending applications, "Method, System, and Apparatus for Transfer of Dies Using a Die Plate," U.S. Ser. No. 10/866,253, and "Method, System, and Apparatus for High Volume Transfer of Dies," U.S. Ser. No. 10/866,149.

In step 3330, a determination is made whether any die remain on the wafer following transfer step 3320. If a determination is made that no dies remain on the wafer, operation proceeds to step 3340. If a determination is made that dies remain on the wafer (and can be recovered), operation proceeds to step 3350.

FIG. 34 shows an exemplary wafer 3400 having a plurality of dies remaining after a transfer step is completed. As shown in FIG. 34, dies have been removed from the center of the wafer. However, dies remain in the periphery of the wafer. For example, as shown in FIG. 34, dies remain at positions of wafer 3400 labeled 1-10, 17, 24, 25, 32, and 39-48. The arrangement of dies remaining on the wafer after the transfer step is dependent upon the shape of the die plate to which the dies are transferred and/or upon the method used for transfer. For example, one or more rows or columns of dies may also remain after the transfer.

In step 3340, the recovery process for the wafer ends.

In step 3350, a die receptacle structure is received. For example, the die receptacle structure may be die receptacle structure 900 shown in FIG. 9A, having as many cells (rows/columns) as desired.

In step 3360, the dies remaining on the wafer are transferred to cells 904 in the die receptacle structure 900. This transfer can be via any means including a pin plate, such as described in co-pending application, "Method, System and Apparatus for Transfer of Dies Using a Pin Plate," U.S. Ser. No. 10/866,159 or via a chip sorter or other similar pick and place technology. If a pin plate is used for the transfer, the pin plate may be designed with a pin configuration to maximize the transfer of the remaining dies. For example, the die recovery pin plate may have a different pin configuration (e.g., pins on the periphery but no pins in the central portion) than the die transfer pin plate. For example, because the configuration of remaining dies on a wafer is known and consistent, a pin plate can be designed to have a substantially similar configuration to the configuration of remaining dies.

Note that all cells in the die receptacle structure may or may not be filled with a die after completion of the recovery process. The resulting die receptacle structure can then be used as a die plate in the device assembly process.

The system and method for recovering untransferred dies described above may be incorporated into the device assembly system described in co-pending application, "Method, System and Apparatus for Transfer of Dies Using a Pin Plate," U.S. Ser. No. 10/866,159 or may be a separate system. If it is a separate system, steps 3310 and 3320 are performed by a device assembly system and some or all of steps 3330 through 3360 are performed by the recovery system.

4.0 Conclusion

While various embodiments of the present invention have been described above, it should be understood that they have been presented by way of example, and not limitation. It will be apparent to persons skilled in the relevant arts that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A method for simultaneously transferring a plurality of integrated circuit dies that are attached to a support structure to a die receptacle structure having a plurality of cells, each cell open at a first surface of the die receptacle structure, comprising:

(a) positioning the support structure and die receptacle structure to be closely adjacent to each other such that each die of the plurality of integrated circuit dies attached to the support structure is simultaneously aligned with a corresponding cell of the plurality of cells;

(b) simultaneously positioning each aligned die of the plurality of integrated circuit dies attached to the support structure within the corresponding cell of the plurality of cells, wherein a bottom interior surface of each cell has an adhesive material; and (c) simultaneously releasing the plurality of aligned integrated circuit dies from the support structure so that each die resides inside the corresponding cell of the plurality of cells and moving apart the support structure and die receptacle structure;

(d) applying a suction at a second surface of the die receptacle structure so that at least a partial vacuum exists in each cell of the plurality of cells due to a hole in the second surface of the die receptacle structure corresponding to each cell and applying a positive pressure at a first surface of the support structure, wherein portions of the die receptacle structure around cells are substantially sharp, wherein step (d) comprises:

allowing the applied suction and the positive pressure to cause the sharp portions of the die receptacle structure to cut the support structure around each die of the plurality of dies, such that each die of the plurality of aligned dies is separated from the support structure and is transferred into the corresponding cell of the plurality of cells by the applied suction.

2. The method of claim 1, wherein said moving step comprises:

moving apart the support structure and die receptacle structure so that each die remains in the corresponding cell due to the adhesive material overcoming an adhesiveness of the support structure.

3. The method of claim 2, wherein the support structure is a tape structure, wherein said moving step comprises:

peeling the support structure from the die receptacle structure.

4. The method of claim 1, wherein a first surface of each die is attached to the support structure, further comprising:

(e) prior to step (a), applying an adhesive material to a second surface of each die of the plurality of dies.

5. The method of claim 1, comprising peeling the support structure from the die receptacle structure.

6. A method for transferring a plurality of integrated circuit dies that are attached to a support structure to a die receptacle structure having a plurality of cells, each cell open at a first surface of the die receptacle structure, comprising:

(a) positioning the support structure and die receptacle structure to be closely adjacent to each other such that each die of a plurality of dies attached to the support structure is positioned inside a corresponding cell of the plurality of cells, wherein a bottom interior surface of each cell has an adhesive material;

(b) releasing each die of the plurality of dies from the support structure so that each die resides inside the corresponding cell of the plurality of cells, wherein releasing each die of the plurality of dies includes:

moving apart the support structure and die receptacle structure;

applying a suction at a second surface of the die receptacle structure so that at least a partial vacuum exists in each cell of the plurality of cells due to a hole in the second surface corresponding to each cell; and (c) applying a positive pressure at a first surface of the support structure, wherein portions of the die receptacle structure around cells are substantially sharp, wherein step (d) comprises:

allowing the applied suction and the positive pressure to cause the sharp portions of the die receptacle structure to cut the support structure around each die of the plurality of dies, such that each die of the plurality of dies is separated from the support structure and is transferred into the corresponding cell of the plurality of cells by the applied suction.

* * * * *

UNITED STATES PATENT AND TRADEMARK OFFICE
CERTIFICATE OF CORRECTION

| | | |
|---|---|---|
| PATENT NO. | : 7,795,076 B2 | |
| APPLICATION NO. | : 10/866150 | |
| DATED | : September 14, 2010 | |
| INVENTOR(S) | : Arneson et al. | |

It is certified that error appears in the above-identified patent and that said Letters Patent is hereby corrected as shown below:

ON THE TITLE PAGE

1. On Page 2, in Field (56), under "OTHER PUBLICATIONS", in Column 2, Lines 59-66, delete ""Bare-Die Feeders,"........................................Jul. 26, 2005, 3 pages."

2. On Page 3, in Field (56), under "FOREIGN PATENT DOCUMENTS", in Column 1, Line 22, delete "WO PCT/US03/23792 1/2004".

3. On Page 3, in Field (56), under "OTHER PUBLICATIONS", in Column 1, Line 28, delete "Acton" and insert -- Action --, therefor.

4. On Page 3, in Field (56), under "OTHER PUBLICATIONS", in Column 2, Line 33, delete "2001" and insert -- 2007 --, therefor.

5. On Page 3, in Field (56), under "OTHER PUBLICATIONS", in Column 2, Line 40, delete "RIFD," and insert -- RFID, --, therefor.

Signed and Sealed this
Tenth Day of July, 2012

David J. Kappos
*Director of the United States Patent and Trademark Office*